US006940047B2

(12) United States Patent
van Kesteren et al.

(10) Patent No.: US 6,940,047 B2
(45) Date of Patent: Sep. 6, 2005

(54) HEAT TREATMENT APPARATUS WITH TEMPERATURE CONTROL SYSTEM

(75) Inventors: Tom A. van Kesteren, Bilthoven (NL); Jan Zinger, Dwingeloo (NL)

(73) Assignee: ASM International N.V., Bilthoven (NL)

( * ) Notice: Subject to any disclaimer, the term of this patent is extended or adjusted under 35 U.S.C. 154(b) by 69 days.

(21) Appl. No.: 10/713,543

(22) Filed: Nov. 14, 2003

(65) Prior Publication Data

US 2005/0115945 A1 Jun. 2, 2005

(51) Int. Cl.[7] .............................................. F27B 5/14
(52) U.S. Cl. ...................... 219/390; 219/405; 219/411; 392/416; 392/418; 118/724; 118/725; 118/50.1; 432/5; 438/799; 438/795; 427/482
(58) Field of Search ................................. 219/390, 405, 219/411; 392/416, 418; 118/724, 725; 432/50.1, 432/5; 438/799, 795; 427/482, 457

(56) References Cited

U.S. PATENT DOCUMENTS

| | | |
|---|---|---|
| 3,947,236 A | 3/1976 | Lasch, Jr. |
| 4,346,433 A | 8/1982 | Rutledge |
| 4,385,362 A | 5/1983 | Arcara |
| 4,495,024 A | 1/1985 | Bok |
| 4,560,590 A | 12/1985 | Bok |
| 4,575,408 A | 3/1986 | Bok |
| 4,630,189 A | 12/1986 | Ohmori et al. |
| 4,639,853 A | 1/1987 | Rake et al. |
| 4,860,687 A | 8/1989 | Frijlink |
| 4,975,561 A | 12/1990 | Robinson et al. |
| 5,178,639 A | 1/1993 | Nishi |
| 5,180,273 A | 1/1993 | Sakaya et al. |

(Continued)

FOREIGN PATENT DOCUMENTS

JP 61294812 A 12/1986

(Continued)

OTHER PUBLICATIONS

Porter, et al., Fast ramp rapid vertical processor for 300-mm Si wafer processing, SPIE vol. 3507, Sep. 1998, p 42-53.

*Primary Examiner*—Shawntina Fuqua
(74) *Attorney, Agent, or Firm*—Knobbe, Martens, Olson & Bear, LLP

(57) ABSTRACT

A floating substrate reactor allows heat treatment of a series of semiconductor substrates, one by one. The heat treatment occurs while flowing gas suspends a substrate between two heated surfaces of the reactor. The two heated surfaces each have multiple heating zones. The heating zones are heated to desired temperature(s) and a substrate is then loaded into the reactor for heat treatment. Upon loading, the relatively cold substrate absorbs heat and cools the process chamber. A heat spike, which can be varied, is applied to the heating zones to heat the reactor to the desired temperature again. The substrate, however, is unloaded from the reactor before the temperatures of the heating zones have reached the desired temperature. After the heating zones have reached the desired temperature, the next substrate in the series of substrates is loaded into the reactor for heat treatment. The heating rate of each heating zone is independently controlled by two nested control loops in a cascade temperature control configuration, permitting differences in the heating rates of the heating zone to be accounted for, thus allowing a uniform temperature or predetermined gradient to be established across all the heating zones. The intensity of the heat spike is recalculated after the introduction of each substrate, using the heating behavior of the previous heat spike as a calculation input, to more accurately heat the heating zones to the desired temperature. The variability of the heat spike intensity from substrate to substrate also allows the throughput of the heat treatment apparatus to be varied.

71 Claims, 12 Drawing Sheets

U.S. PATENT DOCUMENTS

| | | | |
|---|---|---|---|
| 5,314,848 A | 5/1994 | Yasui et al. |
| 5,332,442 A | 7/1994 | Kubodera et al. |
| 5,407,449 A | 4/1995 | Zinger |
| 5,411,076 A | 5/1995 | Matsunaga et al. |
| 5,414,244 A | 5/1995 | Imahashi |
| 5,430,271 A | 7/1995 | Orgami et al. |
| 5,431,700 A | 7/1995 | Sloan |
| 5,464,313 A | 11/1995 | Ohsawa |
| 5,635,409 A | 6/1997 | Moslehi |
| 5,650,082 A | 7/1997 | Anderson |
| 5,790,750 A | 8/1998 | Anderson |
| 5,855,681 A | 1/1999 | Maydan et al. |
| 5,997,588 A | 12/1999 | Goodwin et al. |
| 6,001,175 A | 12/1999 | Maruyama et al. |
| 6,018,616 A | 1/2000 | Schaper |
| 6,064,799 A | 5/2000 | Anderson et al. |
| 6,072,163 A | 6/2000 | Armstrong et al. |
| 6,080,969 A | 6/2000 | Goto et al. |
| 6,097,005 A | 8/2000 | Akimoto |
| 6,099,056 A | 8/2000 | Siniaguine et al. |
| 6,111,225 A | 8/2000 | Ohkase et al. |
| 6,128,586 A | 10/2000 | Pfeiffer |
| 6,183,565 B1 | 2/2001 | Granneman et al. |
| 6,207,936 B1 | 3/2001 | de Waard et al. |
| 6,215,106 B1 | 4/2001 | Boas et al. |
| 6,222,164 B1 | 4/2001 | Stoddard et al. |
| 6,234,788 B1 | 5/2001 | Lee |
| 6,275,744 B1 | 8/2001 | Yoshida |
| 6,329,304 B1 | 12/2001 | Kuznetsov et al. |
| 6,373,033 B1 | 4/2002 | De Waard et al. |
| 6,411,944 B1 | 6/2002 | Ulyanov |
| 6,496,749 B1 | 12/2002 | Yamaguchi et al. |
| 6,501,998 B1 | 12/2002 | Pfeiffer |
| 2003/0027094 A1 | 2/2003 | Storm et al. |
| 2003/0092231 A1 | 5/2003 | Granneman et al. |
| 2003/0209200 A1 | 11/2003 | Kuznetsov et al. |
| 2003/0209327 A1 | 11/2003 | Kuznetsov et al. |

FOREIGN PATENT DOCUMENTS

| | | |
|---|---|---|
| JP | 62021237 A | 1/1987 |
| JP | 02034915 A | 2/1990 |
| JP | 04078130 A | 3/1992 |
| JP | 08236533 | 9/1996 |
| JP | 10321505 | 12/1998 |
| WO | WO 90/13687 | 11/1990 |
| WO | WO 98/01890 | 1/1998 |
| WO | WO 00/42638 | 7/2000 |
| WO | WO 00/68977 | 11/2000 |

HEAT TREATMENT APPARATUS WITH TEMPERATURE CONTROL SYSTEM

REFERENCE TO RELATED APPLICATIONS

This application is related to U.S. application Ser. No. 10/151,207, METHOD AND DEVICE FOR THE HEAT TREATMENT OF SUBSTRATES, filed May 16, 2002; U.S. application Ser. No. 10/186,269, METHOD AND APPARATUS FOR THE TREATMENT OF SUBSTRATES, filed Jun. 27, 2002; U.S. application Ser. No. 10/141,517, TEMPERATURE CONTROL FOR SINGLE SUBSTRATE SEMICONDUCTOR PROCESSING REACTOR, filed May 8, 2002; U.S. application Ser. No. 10/410,699, TEMPERATURE CONTROL FOR SINGLE SUBSTRATE SEMICONDUCTOR PROCESSING REACTOR, filed Apr. 8, 2003; U.S. application Ser. No. 10/619,383, HYBRID CASCADE MODEL-BASED PREDICTIVE AND PROPORTIONAL-INTEGRAL-DERVATIVE TEMPERATURE CONTROL SYSTEM FOR VERTICAL THERMAL REACTORS, filed Jul. 14, 2003; and the patent application entitled METHOD FOR THE HEAT TREATMENT OF SUBSTRATES, filed Oct. 31, 2003, Ser. No. 10/700,298.

BACKGROUND OF THE INVENTION

1. Field of the Invention

This invention relates generally to heat treatment apparatuses for processing semiconductor substrates and, more particularly, to thermal reactors and their temperature control systems.

2. Description of the Related Art

Reactors which can process a substrate while suspending the substrate without directly mechanically contacting the substrate, e.g., by floating the substrate on gas cushions, have relatively recently been developed for semiconductor processing. These reactors may be called floating substrate reactors. Such a reactor is commercially available under the trade name Levitor® from ASM International N.V. of Bilthoven, The Netherlands.

In the Levitor® reactor, which is also described in U.S. Pat. No. 6,183,565 B1, a substrate, such as a wafer, is supported by two opposite gas flows emanating from two heated and relatively massive reactor blocks located on opposite sides of the substrate. Each reactor block preferably also includes a heated section, or furnace body, for transferring heat to the substrate during processing. The furnace body preferably forms part of a boundary surface of the reactor block. The boundary surface is oriented to face the substrate and is preferably substantially flat. A small gap of less than about 1 mm is typically maintained between each block and the corresponding substrate surface. The small gap results in a rapid heat transfer from the furnace bodies to the substrate by conduction through the gas when the substrate is processed, e.g., during a heat treatment, or exposure to elevated temperatures. An advantage of reactors such as the Levitor® reactor is that the relatively massive reactor blocks of the reactor act as thermal "fly-wheels," resulting in a very stable temperature and reproducible performance.

In addition, the heat-up of the substrate is very uniform, as the substrate is not mechanically contacted during the heat treatment. In comparison, where a transport arm transports a substrate into the reactor and then continues to support the substrate during processing, mechanical contact by support fingers of the transport arm can result in cold spots at their points of contact with the substrate during heat-up, as the support fingers represent extra thermal mass that must be heated and that locally slows down the heat-up rate during processing. Alternatively, where a substrate is transported to the reactor and then handed off to support pins that remain in the reactor after processing, mechanical contact by support pins during processing can result in hot spots on the substrate at their contact positions, as the support pins may already have been heated by a previous process. Advantageously, by floating a substrate during processing, these cold or hot spots can be avoided and thermal stresses, possibly resulting in crystallographic slip, can also be avoided.

Floating substrate reactors and methods for using such reactors for successive heat treatment of a series of planar substrates, one by one, is described in U.S. Patent Application Publication No. 2003/0027094 A1, published Feb. 6, 2003, and assigned to ASM International, N.V., the disclosure of which is incorporated herein by reference in its entirety. In those methods, a furnace body of a reactor block is typically continuously heated. After the furnace body has reached a desired temperature, as measured at a boundary surface of the furnace body, a relatively cold substrate is placed for heat treatment in the vicinity of the furnace body. Because it is generally colder than the furnace body, the substrate will withdraw heat from the furnace body. This heat withdrawal can be measured by measuring the temperature of the furnace body close to the boundary surface. The substrate is then heat treated. Because of the typically relatively short heat treatment time as compared to the thermal recovery time of the furnace body, the substrate is removed from the vicinity of the furnace body before the temperature of the continuously heated furnace body rises to the desired temperature again. After the temperature of the boundary surface rises to the desired temperature, another substrate is placed in the vicinity of the furnace body for heat treatment.

A purpose of the methods described in U.S. patent application Publication 2003/0027094 A1 is to achieve a reproducible heat treatment of each of the substrates. In the preferred embodiments of that application, this is achieved by having the furnace body at the desired temperature when a substrate is positioned for heat treatment, then removing the substrate from the vicinity of the furnace body before the temperature of the furnace body has recovered, and then waiting until the furnace body reaches the desired temperature again before positioning the next substrate in the vicinity of the furnace body for heat treatment. Thus, each substrate experiences roughly the same profile of heat treatment temperatures over time during the course of the heat treatment.

In addition, to make the temperatures over the boundary surface of the reactor block more uniform, the boundary surface typically comprises multiple heating zones, which can be controlled independently. By appropriately controlling the temperatures of these zones, a uniform temperature can be achieved over the part of the reactor block facing the substrate. Alternatively, the independent controls allow for a desired temperature gradient to be set up over the part of the reactor block facing the substrate.

Although the above-described methods and apparatuses allow for a reproducible thermal treatment of a series of substrates, the timing for treating successive substrates is relatively fixed, limiting the throughput flexibility of the reactor. In addition, even with independently controlled heating zones, the thermal recovery time may differ between the different heating zones, resulting in non-uniformities in the heat treatment temperature profile over the boundary surface.

Accordingly, there exists a need for apparatuses and methods of controlling the throughput of a floating substrate reactor and of making the temperature across a boundary surface of the reactor block more uniform.

SUMMARY OF THE INVENTION

It is an object of the present invention to provide a solution for the problems described above. A heat treatment apparatus is provided comprising a heated furnace body wherein not only the temperature of the furnace body, and any heating zones of the furnace body, can be controlled but wherein also the thermal recovery rate of the furnace body, after placing a cold substrate in its vicinity for heat treatment, is controllable.

According to one aspect of the invention, a heat treatment apparatus is provided for successively heat treating a series of planar substrates one by one. The apparatus comprises a furnace body having a boundary surface oriented to face one of the series of substrates upon positioning of the substrate in the heat treatment apparatus for heat treatment. A time from positioning one of the series of substrates to positioning a next one of the series of substrates constitutes a heat treatment cycle and heat treating the series of substrates comprises a plurality of heat treatment cycles. A controllable heater is configured to heat the furnace body at a power level set by a power setting of the heater. A heat treatment temperature sensor is configured to measure a treatment temperature experienced by the substrate during heat treatment. The apparatus also comprises a temperature regulator for controlling the treatment temperature. The temperature regulator is configured to receive a heat treatment temperature reading from the treatment temperature sensor, to receive a desired temperature input for a desired treatment temperature and to generate and to output the power setting for the heater. The temperature regulator comprises a first computational component configured to generate one or more trigger signals resonant with a frequency of the heat treatment cycles. The temperature regulator also comprises a second computational component configured to calculate a control set-point that at least partially determines the power setting for the heater. The second computational component is further configured to receive the trigger signals and to calculate, upon receiving the trigger signals, a new control set-point using the treatment temperature readings and to hold the new control set-point until the calculation is triggered again by a next trigger signal.

According to another aspect of the invention, a semiconductor processing reactor is provided for individually treating a series of substrates. The reactor comprises a boundary surface for facing one of the series of substrates during heat treatment, wherein the boundary surface comprises a plurality of heating zones. A plurality of temperature sensors are proximate the boundary surface. The plurality of temperature sensors is configured to measure a boundary surface temperature of each heating zone. A plurality of independently controlled heaters heats each of the plurality of heating zones to a desired processing temperature, with each heater having a control set point for determining a power level of that heater. The reactor also comprises a substrate loading signal generator configured to trigger a loading of one of the series of substrates into the reactor about when one or more of the plurality of heating zones reaches a desired processing temperature. In addition, the reactor includes one or more temperature controllers for regulating the boundary surface temperature. The one or more temperature controllers is configured to receive the temperature readings and to calculate, at a recalculation frequency resonant with a loading frequency of each of the series of substrates, a next control set-point for each heating zone for a next one of the series of substrates.

According to yet another aspect of the invention, an apparatus configured to process a plurality of substrates one by one is provided for semiconductor processing. The apparatus comprises a heating body having a surface delimiting a substrate processing position. A controllable heater is provided for heating the heating body, wherein the heater is proximate the heating body and has a control set-point controlling a heater temperature. A heat treatment temperature sensor is configured to trigger a loading of one of the series of substrates when a temperature at the substrate processing position reaches a desired temperature. A timer is configured to determine an instantaneous actual throughput of the apparatus. The apparatus also comprises a temperature regulator for controlling the processing temperature. The temperature regulator is configured to receive a throughput input indicating a desired processing throughput and to calculate and to output, after the loading of the one of the series of substrates is triggered, a new control set-point to the heater based at least partially upon the throughput input and the instantaneous actual throughput.

According to another aspect of the invention, a method is provided for semiconductor processing. The method comprises providing a reactor having a process chamber that has a process temperature. The reactor has a heater for heating the chamber to a desired process temperature. The heater has a control set-point for determining a power level of the heater.

Each of the series of substrates is successively loaded into the chamber and then unloaded out of the chamber. Loading of a substrate into the chamber reduces the process temperature and the heater set at the control set-point heats the chamber back up to the desired process temperature after loading the substrate reduces the process temperature. The loading is performed about when the chamber is at the desired process temperature and unloading is performed before the substrate reaches the desired process temperature again. The method also comprises monitoring the chamber for a calculation condition, wherein meeting the calculation condition triggers a calculation of a new control set-point based upon one or more process temperature readings before or during about when the calculation condition is met. Calculation of the new control set-point is performed at a frequency resonant with a substrate loading or unloading frequency, wherein the control set-point is held until the calculation condition is met again.

According to yet another aspect of the invention, a method for individually heat treating a series of semiconductor substrates is provided. The method comprises providing a reactor having a heat treatment position for heat treating each of the series of substrates. The reactor has a throughput input indicating a desired heat treatment throughput of substrates and a treatment temperature input indicating a desired treatment temperature. The reactor also has a heater with a control set-point for establishing the desired treatment temperature at the heat treatment position.

The method further comprises successively positioning each of the series of substrates at and removing each of the series of substrates from the heat treatment position, wherein a time from loading one substrate to a next substrate constitutes a substrate cycle. The treatment temperature as a function of time is measured and only one new control set-point is calculated and applied during each substrate cycle. The new control set-point is determined at least partially based upon the desired treatment temperature, the measured treatment temperature, and the desired heat treatment throughput for the series of substrates.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENT

Figure 1:
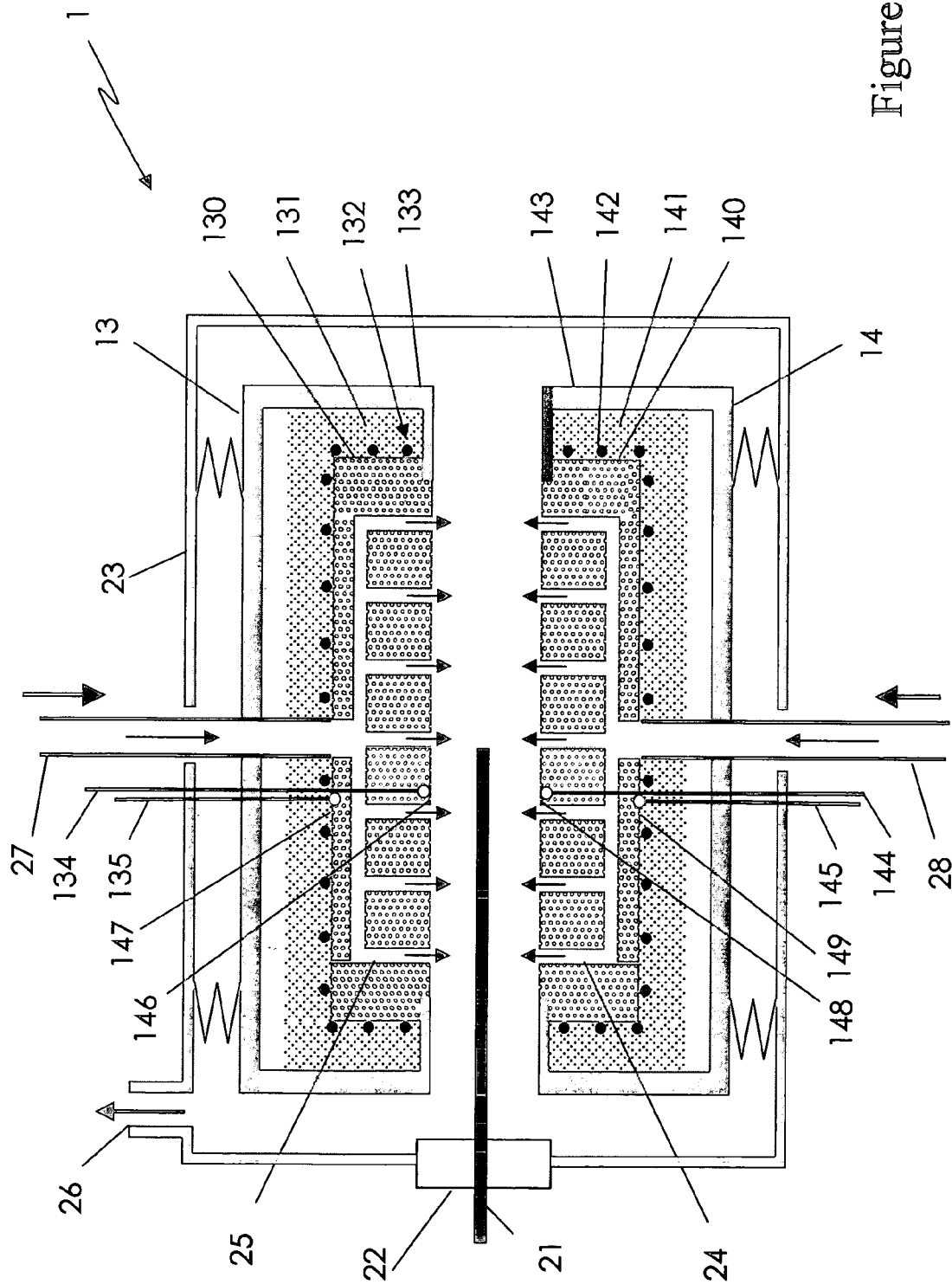
FIG. 1 shows, diagrammatically, the loading of a substrate into an exemplary floating substrate reactor, with the reactor shown in an open position, in accordance with preferred embodiments of the invention.

While the methods and apparatuses described in U.S. patent application Publication No. 2003/0027094 A1 allow for a reproducible heat treatment, the decrease in temperature caused by the loading of a substrate limits the processing throughput because time is needed for a furnace body to thermally recover to the desired process temperature. In particular, the time between the moment a substrate is removed from the vicinity of the furnace body and the moment when the furnace body reaches the desired temperature again often constitutes an unproductive waiting time in which the treatment apparatus is not being utilized to process a substrate. Ideally, the waiting time is not too long so as not to lose valuable throughput. This is an especially significant concern where substrates are processed one by one, since any increase or decrease in waiting time is multiplied by all the substrates that are to be processed. On the other hand, the waiting time is preferably not so short that the system logistics cannot cope with the required timing of the movement of substrates. It has been found, however, that the ability to vary throughput, e.g., in response to system demands or other processing conditions, is limited in previous methods and apparatuses because, among other things, the temperature control systems of those methods and apparatuses heat the furnace bodies in a relatively constant manner, resulting in a particular thermal recovery rate that, in turn, dictates a particular duration for thermal recovery.

In addition, where a reactor block boundary surface has multiple heating zones, all these zones ideally reach their desired temperatures at the same time. This is important since a wafer is preferably not loaded for treatment until all zones reach their desired temperature, or until an average temperature of all the zones is a desired temperature. It has been found, however, that the thermal recovery rate, or heating rate, of a heating zone can depend on various factors, including its design, its location and the temperature controller used to regulate its temperature. For example, the heating of neighboring zones can affect the heating of a particular heating zone in a non-linear manner. In addition, some zones will be surrounded by more neighboring zones than other zones, with the heat from these neighboring zones causing the zones with more neighbors to heat more quickly than the zones with fewer neighbors. Also, while the temperatures of each zone can be actively monitored and independently controlled, because of the lag between a change in the power of a heater and the temperature at the surface of a furnace, or heating, body, it is difficult to account for the contributions of neighboring zones and to precisely control the temperatures at the surface of a particular zone. Additionally, the amount of heat withdrawn from a heating zone in relation to its thermal mass may vary between zones.

Because of these variables, the recovery rate of each heating zone is typically not the same, causing unintended temperature non-uniformity across the boundary surface of a reactor block, e.g., a zone at the center of the boundary surface and a zone in a peripheral area of the boundary surface can reach their desired temperature at different times. In particular, some heating zones can overshoot its desired temperature in the time that other zones are still being heated to their desired temperatures, even if the desired temperatures of all the zones are set to be the same.

The preferred embodiments address these concerns by providing apparatuses and methods that allow dynamic control of the heating of the furnace bodies, preferably including individual heating zones within the furnace bodies. To control the rate at which a furnace body recovers to a desired temperature after loading of a cold substrate into the apparatus cools the furnace body, the preferred embodiments provide, among other things, an advantageous arrangement for varying and timing the variation of the heating power applied to the furnace body. It will be appreciated that the substrate is preferably removed from the apparatus before the desired temperature is reached again and that a new substrate is preferably processed when the desired temperature is reached again.

Preferably, the heating power intensity for a particular substrate is calculated by a temperature controller or regulator based upon the desired processing throughput and the actual processing throughput and/or the desired process temperature and the actual process temperature reached by the furnace body during processing. It will be appreciated that the actual throughput and the actual process temperatures are a function of the recovery behavior, or recovery rate, of the furnace body and can be measured by using a timer and temperature sensor to determine the temperature of the furnace body over time. In a preferred embodiment, the temperature reached by the furnace body before a temperature decrease caused by the loading of a substrate, along with the time required for the furnace body to reach the desired temperature after the loading of a previous substrate for processing, are measured. Taking into account these inputs, the heating power intensity for processing the next substrate can be increased or decreased based upon whether the recovery rate is required to be increased or decreased, respectively. Thus, based upon the feedback provided by these inputs, the heating power intensity can be varied to arrive at the desired throughput and to more accurately control the temperature of a furnace body.

Preferably, the change in the intensity of the heating power is also made at a consistent time within a wafer cycle after taking the sampled data to ensure consistency of thermal budget from substrate to substrate. In addition, for ease of computation and to ensure that the data accurately reflects the process conditions at the moment the intensity is changed, the temperature data is preferably taken immediately before the calculation of a new intensity and the change of the heating power to that intensity.

More preferably, the heating power intensity is recalculated and reset by a computational component of the temperature controller or regulator at a frequency resonant with the frequency at which a series of substrates is processed. For example, a substrate positioning indicator can be used to sense the loading or unloading of a substrate to trigger a recalculation and resetting of the intensity. In other embodiments, the recalculation and resetting can occur at one or more intervals between loading of successive substrates, such as at the moment of loading, at the moment of reaching the minimum temperature, or at the moment of unloading. Preferably, however, the intensity is changed once per cycle and the temperature data are taken immediately before making this change.

The heating power itself is preferably applied to the furnace body after placement of a substrate in the vicinity of the furnace body and preferably continues until about when the furnace body reaches the desired temperature, which triggers the positioning of another wafer for processing. As discussed below, in some preferred embodiments, the recalculation of the heating power intensity and the application of heating power of that intensity to the furnace body is triggered by the positioning of a wafer for processing or by a reduction in temperature caused by the positioning of a wafer for processing.

Thus, by use of a heating power having an intensity that can vary from substrate to substrate, the preferred embodiments are not bound by the fixed thermal recovery waiting time that can result from relatively constant heating of the furnace body over the course of processing a series of substrates. Advantageously, processing throughput can be controlled by varying the intensity of the heating power. For example, heating power of a higher intensity can be applied to decrease the time required to reach the desired temperature, while heating power of a lower intensity can be applied to increase the waiting time between heat treatment of substrates, i.e., the time between unloading of a substrate and loading of the next substrate. This variability allows the rate at which substrates can be positioned in a reactor for heat treatment to be varied, permitting control over the throughput of the reactor and also giving adequate time for the processing system logistics to function. For example, the thermal recovery rate can be increased to increase processing throughput, or the recovery rate can be decreased if the thermal recovery duration is otherwise too short for, e.g., substrate transport functions to be complete before a new substrate is to be treated. Also, the ability to vary the heating power intensity over the course of processing a series of substrates advantageously allows throughput to be actively varied in the course of treating a series of substrates, depending on, e.g., the needs and processing capabilities of associated processing tools.

In addition, feedback provided by sampling data from each wafer processing cycle allows the heating power intensity to be set more accurately to more accurately control the thermal recovery rate and the heat treatment temperature at the moment of placing the next substrate in the vicinity of the furnace body. It will be appreciated that a wafer processing cycle spans the time from loading of a particular wafer to the unloading of that wafer and the subsequent loading of the next wafer for processing. To ensure a consistent reference point to make accurate comparisons with the sampled data, e.g., temperature measurements, the data is preferably sampled at a predetermined time relative to the beginning or ending of each wafer cycle. For example, the data can be sampled at a predefined duration after the beginning or before the end of a cycle or a predefined fraction of the duration of a cycle. As discussed below, rather than taking a measurement instantaneously, the sampling preferably takes place over a particular window of time. In some arrangements, this window can be one or several seconds. In other arrangements, the window can have the length of the entire wafer cycle, such that temperature data for setting the heating power intensity of a new wafer cycle is simply the average temperature of a heating zone over the course of the previous wafer cycle.

For even greater control over the temperatures experienced by a substrate, in the preferred embodiments, multiple heating zones are preferably provided at the boundary surface which faces a substrate during heat treatment. It will be appreciated that the heating zones can be physically separate masses that together constitute a furnace body or can be separately heated parts of a single furnace body. In either case, each heating zone preferably has a separate heater which is preferably individually controlled and, so, has an independently variable heating power intensity. Consequently, the heating power intensity of each heating zone can be chosen to account for the different thermal recovery rates of the various zones (as determined by the temperature measurements taken at about the time when positioning of a substrate was triggered and by the length of a wafer cyle), so that all zones reach a desired temperature at the same time. In other arrangements, different heating zones can be set to reach different temperatures at a particular time, e.g., where a temperature gradient over a substrate surface is desired. In such cases, the variable heating power intensity allows for more accurate control over the temperatures of the gradient.

It will be appreciated that the heating power intensity is determined by the power setting of the heater and that the power setting is preferably determined by a control set-point. In some embodiments, the control set-point is an input to an intermediate controller that, e.g., ensures that the heater provides the correct heating power to a furnace body, as indicated by the control set-point. For example, the control set-point can be the desired temperature for a part of the furnace body near the heater and the intermediate controller can be used to regulate the power setting of the heater to ensure that that part is at about the desired temperature. For this purpose the intermediate controller will also receive temperature measurements for a part of furnace body near the heater as an input. In other preferred embodiments, the control set-point is the power setting itself and the heater is maintained at that power setting until the calculation and application of a new power setting. In such arrangements, no intermediate controller is needed to modify the control set-point value to output a power setting to the heater.

In the illustrated embodiments, the temperature of the furnace body, or of an individual heating zone of a furnace body having multiple heating zones, is preferably controlled by two temperature control loops arranged in a cascade temperature control configuration. Preferably, at least two temperature sensors are provided, a first temperature sensor for measuring a temperature of a furnace body near a heater providing the heating power and a second temperature sensor for measuring a temperature of the furnace body near a boundary surface facing the substrate. The first temperature sensor is connected to a first temperature control loop and the second temperature sensor is connected to a second temperature control loop.

The first, or inner, loop regulates the temperature of the furnace body adjacent the heat source by monitoring the temperature at the first sensor and by controlling the power delivered to the heat source by outputting a power setting to the heater, thereby controlling the intensity of the heat generated by the heater. The second, or outer, loop regulates the temperature at the boundary surface by monitoring the temperature at the boundary surface and by outputting a control set-point to the first control loop to determine the temperature set-point, or backside set-point, of the first loop. The second loop also has a temperature set-point, which is preferably the desired temperature for heat treatment of a substrate. Thus, the second control loop ensures that the boundary surface is at the desired temperature for heat treatment by controlling the backside set-point of the first control loop, thereby at least partially determining the heater's power setting and controlling the heating power supplied to the furnace body.

The first control loop monitors the readings of the first temperature sensor and sets the power setting of the heat source at a high frequency, e.g., at intervals of about every second or less, to ensure real-time control of the temperature of the furnace body at the first temperature sensor. Because of the mass of the furnace body and the distance between the heat source and the boundary surface of the furnace body facing the substrate, there is a substantial lag between a rise in the temperature of the heat source and the temperature at the furnace body surface. Thus, since changes in the temperature of the heat source are not transmitted instantly to the boundary surface, the second control loop can monitor the readings of the second temperature sensor at the same or a lower frequency than the first control loop.

Preferably, the second control loop has a loading input indicating when a substrate is positioned adjacent to the furnace body for heat treatment. The second control loop preferably also has a trigger and suspend function to regulate the calculation and outputting of a set-point for the first control loop. The positioning of a substrate for treatment, or the detection of a decrease in temperature at the boundary surface preferably triggers the calculation of a new control set-point for the first control loop, which new control set-point is applied and maintained until a next substrate is positioned for treatment.

The measurements from the second temperature sensor are preferably stored in a memory and the second control loop set-point calculations preferably only take into account the measurements during a time period immediately before the temperature of the furnace body drops due to positioning a substrate for treatment or upon positioning of the substrate for treatment. A time window filter is preferably provided to filter out temperature readings outside of this time period. In other embodiments, the time window filter can simply determine the highest temperature reached by the boundary surface during the course of processing and filter out readings outside of a predefined time window which includes this highest temperature.

Thus, by reference to this filtered data, the control set-point calculations can be based upon the feedback gained from a comparison of the process temperature set-point and the actual temperature of the furnace body at its boundary surface at the trigger moment. Assuming similar conditions, such as uniformity in substrate thermal properties, this feedback helps to provide data concerning whether the new set-point temperature must be set to increase or decrease the thermal recovery rate and/or furnace body temperature.

It will be appreciated that processing can lead to differences in the filtered data for several reasons, including thermal interactions amongst the various heating zones combined with the use of an composite number to trigger positioning of another substrate for treatment. Thus, the temperatures of some zones can be above or below the composite number. In addition, the filtered data typically encompasses a window while the number to trigger positioning is an exact value. As such, the temperatures within this window can differ due to differences in the heating rate of different zones of the furnace body.

In addition, in other embodiments, the second control loop is in communication with a throughput controller which receives throughput inputs or settings concerning the desired throughput of the reactor. The second control loop also takes into account this throughput input to regulate the thermal recover rate, by increasing or decreasing the control set-point, so as to arrive at the desired throughput.

Reference will now be made to the Figures, wherein like numerals refer to like parts throughout.

It will be appreciated that while the preferred embodiments can be applied to other reactors known to those of skill in the art, use of a floating substrate reactor is particularly advantageous. For example, the reactor design illustrated in FIGS. 1–3 does not require that a substrate 21 be mechanically supported during processing; that is, the substrate 21 can be processed without being directly contacted by a solid support. This enables very uniform and rapid heating of the substrate 21 without the cold spots that can occur in reactors where substrates are mechanically contacted during a semiconductor fabrication process. In addition, the upper and lower blocks 13 and 14 of the reactor 1 surrounding the substrate are preferably relatively massive such that each has a high heat capacity relative to the substrate 21, helping to stabilize the temperature of the substrate and minimizing the susceptibility of the reactor 1 to temperature fluctuations upon loading and unloading of the substrate 21 into the reactor 1. The basic configuration of the reactor 1 is available commercially under the trade name Levitor® from ASM International, N.V. of The Netherlands.

Figure 2:
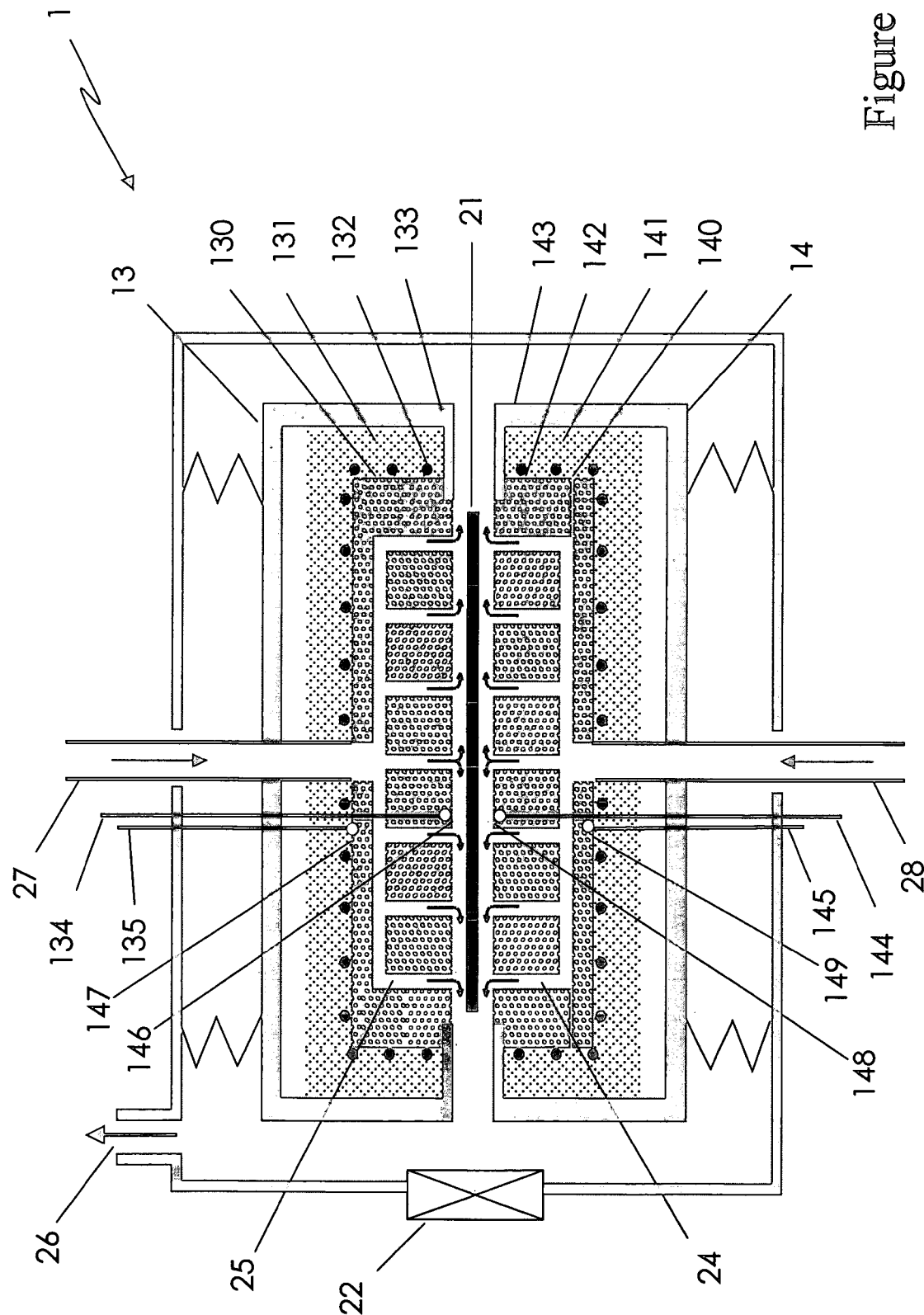
FIG. 2 shows, diagrammatically, the treatment of a substrate in an exemplary floating substrate reactor, with the reactor shown in a closed position, in accordance with preferred embodiments of the invention.
Figure 3:
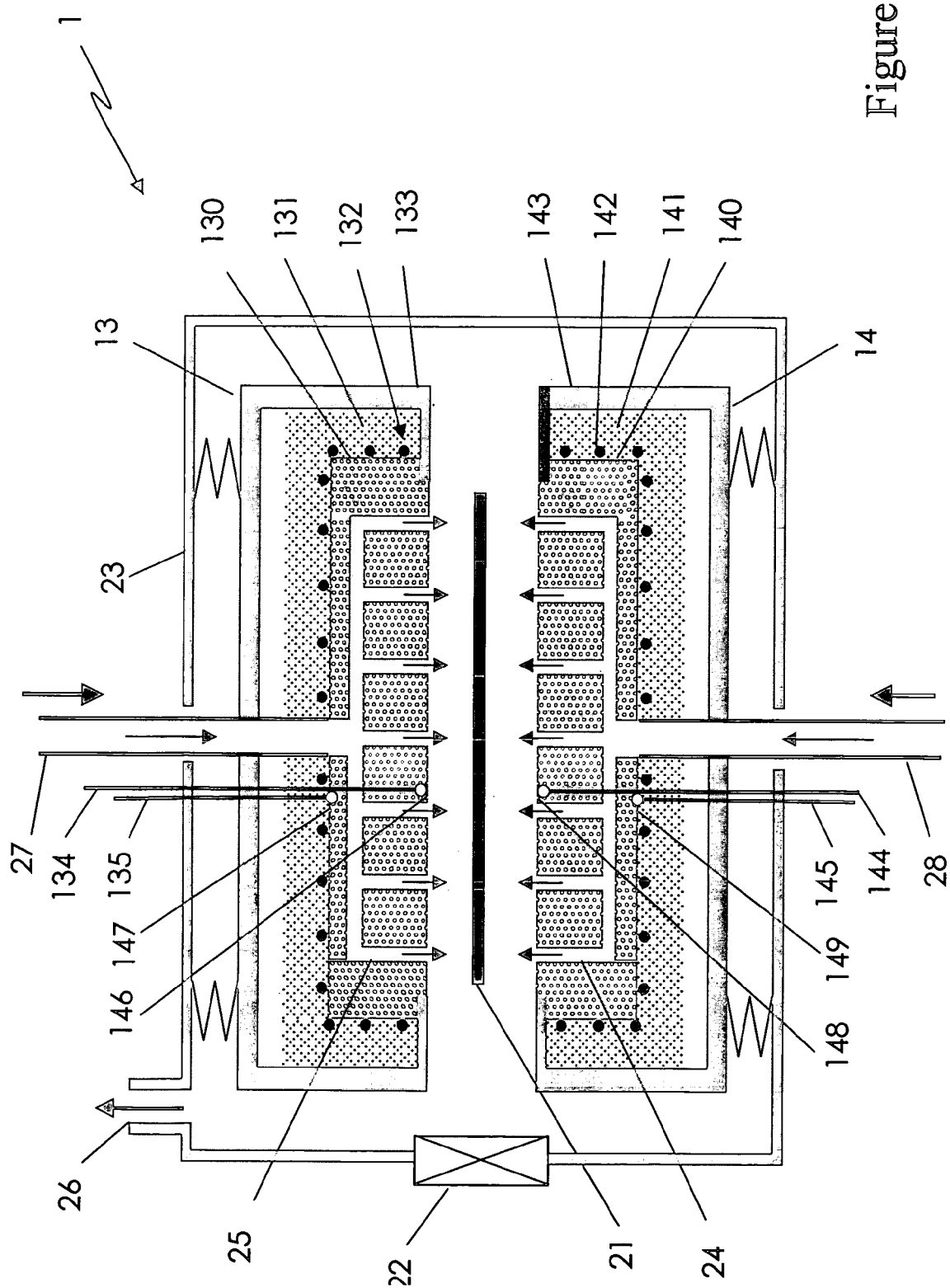
FIG. 3 shows, diagrammatically, the treatment of a substrate in an exemplary floating substrate reactor, with the reactor shown in an open position, in accordance with preferred embodiments of the invention.

As shown in FIGS. 1 to 3, the heat treating apparatus of the reactor 1 includes an upper block 13 and a lower block 14 that are in a housing 23. It will be appreciated that the surfaces of the blocks 13 and 14 facing each other delimit a chamber for processing or treating a substrate 21. As shown in FIG. 1, the housing 23 is preferably provided with a flap 22 that can be opened for loading and subsequently removing a substrate 21. The lower block 14 and the upper block 13 can be moved towards one another by lifting rods 27 and 28. Alternatively, only one of the blocks is moveable.

The upper block 13 is made up of an upper furnace body 130, an insulating jacket 131, a heating coil or furnace body heater 132 arranged on the inside of the insulating jacket 131, and an outer jacket 133. Similarly, the lower block 14 is made up of a lower furnace body 140, an insulating jacket 141, a heating coil 142 arranged on the inside of the insulating jacket 141, and an outer jacket 143. Preferably, each furnace body 130, 140 has a mass greater than 10 times the mass of a substrate for which the reactor 1 is designed to accommodate, more preferably greater than 40 times the substrate mass.

The upper furnace body 130 is preferably provided with at least one temperature sensor 134 and the lower furnace body 140 is preferably also provided with at least one temperature sensor 144. As discussed above, in one preferred arrangement, the temperature sensors 134, 144 are arranged to measure temperatures close to the surfaces 146 and 148 of the furnace bodies 130, 140, respectively, that are adjacent to the substrate 21. The temperature sensors 134, 144 are placed sufficiently close to the furnace body surfaces 146 and 148 to gauge the process temperatures experienced by the substrate 21 during a heat treatment and to detect a reduction in temperature of the furnace bodies 130, 140 caused by positioning of the substrate 21 in its vicinity for heat treatment. Preferably, the temperature sensors 134, 144 are less than about 5 mm and, more preferably, less than about 2 mm away from the surfaces 146 and 148, respectively. Thus, the temperature sensors 134, 144 are also called "process" or "second" temperature sensors herein.

The upper furnace body 130 is also preferably provided with at least one other temperature sensor 135 that is arranged close to the heater side 147 of the upper furnace body 130 that faces the heating coil 132. In a similar manner, the lower furnace body 140 can be provided with a temperature sensor 145 arranged close to the side 149 of the lower furnace body 140 that faces the heating coil 132. Because they are placed close to the heating coils 132, 142, the temperature sensors 135, 145 are called "backside" or "first" temperature sensors herein.

Process gases (including inert gases) are supplied both from the upper furnace body 130 through openings 25 and the lower furnace body 140 through openings 24. The gases can be discharged through a discharge opening 26 formed in the reactor housing 23.

The upper block 13 and the lower block 14 are preferably moved apart before introducing the substrate 21 into the reactor 1, as shown in FIG. 1. After the substrate 21 has been introduced into the reactor 1, the blocks 13 and 14 are moved towards one another by the lifting rods 27 and 28 in such a way that the distance between the substrate 21 and the adjacent surfaces 146 and 148 of the furnace bodies 130 and 140, respectively, is reduced. Preferably, when positioned at a heat treatment position, the substrate 21 is less than about 2 mm and more preferably less than about 1 mm from the surfaces 146 and 148. In the illustrated embodiment, as shown in FIG. 2, the substrate is held in a stable position by gas streams issuing from the openings 24 and 25, without requiring further mechanical support. It will be appreciated, however, that in other arrangements, support structures such as support pins can be used to support and space the substrate from the bodies 130 and 140. Moreover, while illustrated as being symmetrically spaced from the bodies 130 and 140, the substrate 21 can be spaced closer to one or the other of the bodies 130 or 140 in other arrangements.

Figure 4:
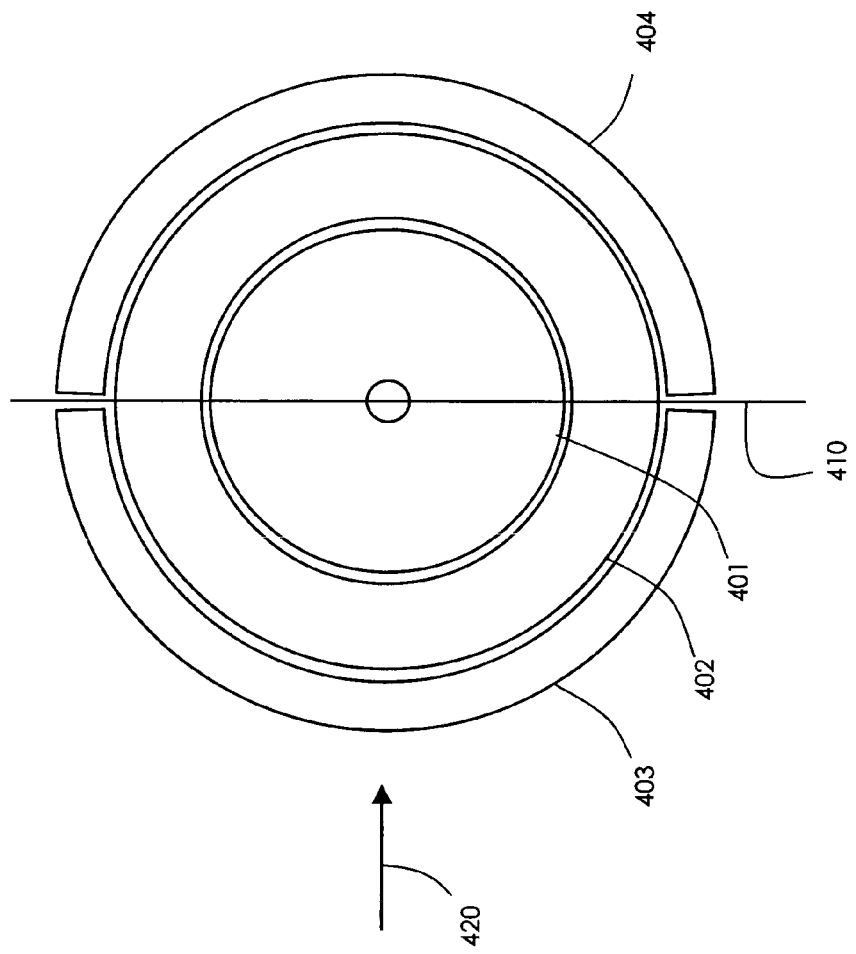
FIG. 4 shows, schematically, an exemplary configuration of multiple heating zones in a floating substrate reactor, in accordance with preferred embodiments of the invention.

In some preferred embodiments, the furnace bodies 130, 140 each comprise multiple heating zones so that the lateral temperature profile across the furnace body can be adjusted. An example of a multiple heating zone configuration is shown in FIG. 4. A disk shaped center zone 401 is surrounded by an annular middle zone 402. At the periphery of the furnace body 130 or 140 a front zone 403 and a rear zone 404 are provided, forming together a peripheral annular zone surrounding the annular middle zone 402. The front zone 403 and rear zone 404 are located at opposite sides of the centerline 410. A direction for loading a substrate 21 into the reactor 1 (FIGS. 1–3) is indicated by the arrow 420.

The upper furnace body 130 and the lower furnace body 140 can be configured to have an identical multiple zone arrangement, e.g., each having zones 401, 402, 403 and 404 as described above. In other arrangements, the multiple zones of the upper and the lower furnace bodies 130 and 140, respectively, can be rotated relative to each other. The rotation can be chosen such that, e.g., their respective centerlines 410 make an angle of about 90 degrees with each other and opposite angles of about 45 degrees with the loading and unloading directions 420 and 430, respectively. Alternatively, the rotation can be chosen such that their respective center-lines 410 make an angle of about 120 degrees with each other. In addition, other multiple zone configurations can be chosen, having more or fewer zones or having zones of different shapes and/or spatial orientations. Preferably, as discussed below, each heating zone has separate temperatures sensors 134, 144, 135 or 145 and independently controlled heaters 132, 142.

Figure 5:
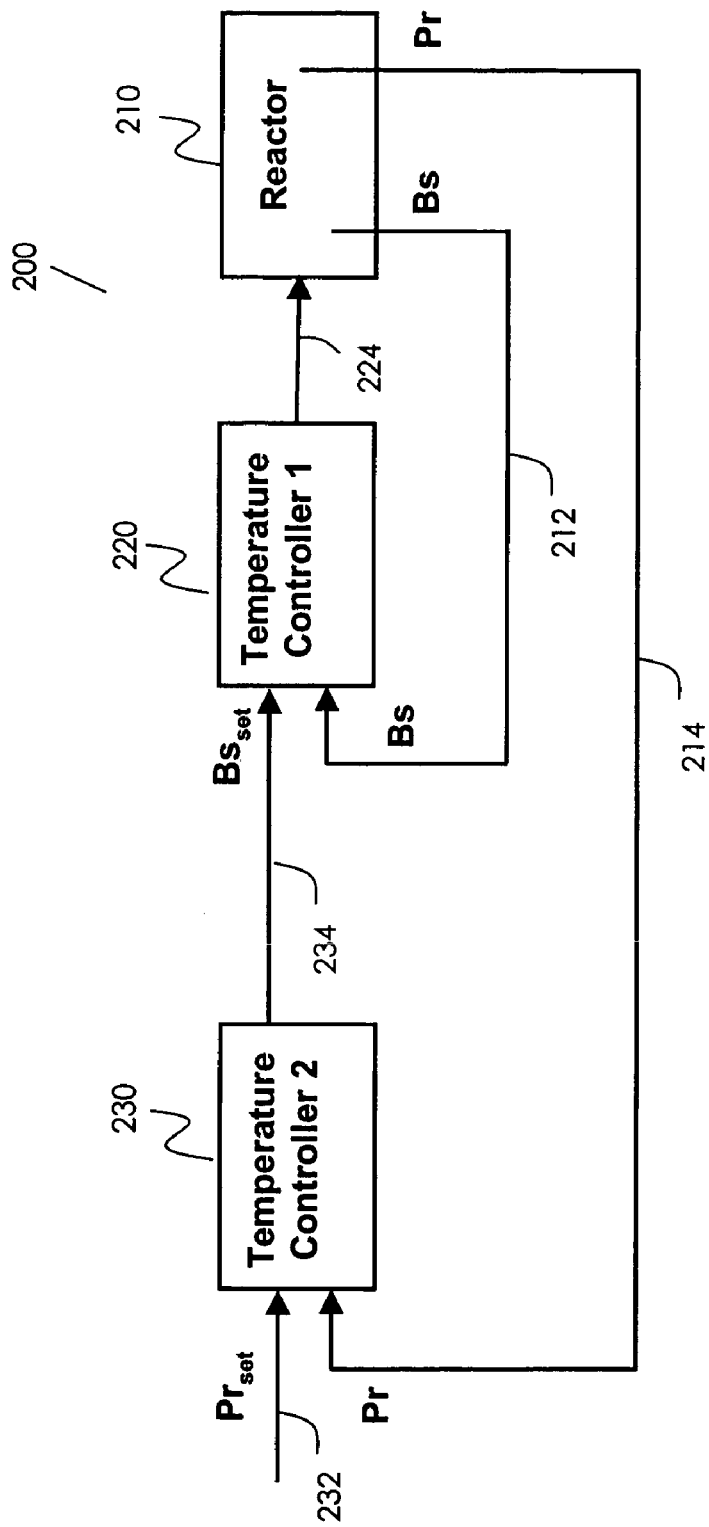
FIG. 5 shows, schematically, a temperature controller having two nested control loops, in accordance with an embodiment described in U.S. patent application Publication 2003/0027094 A1.
Figure 6:
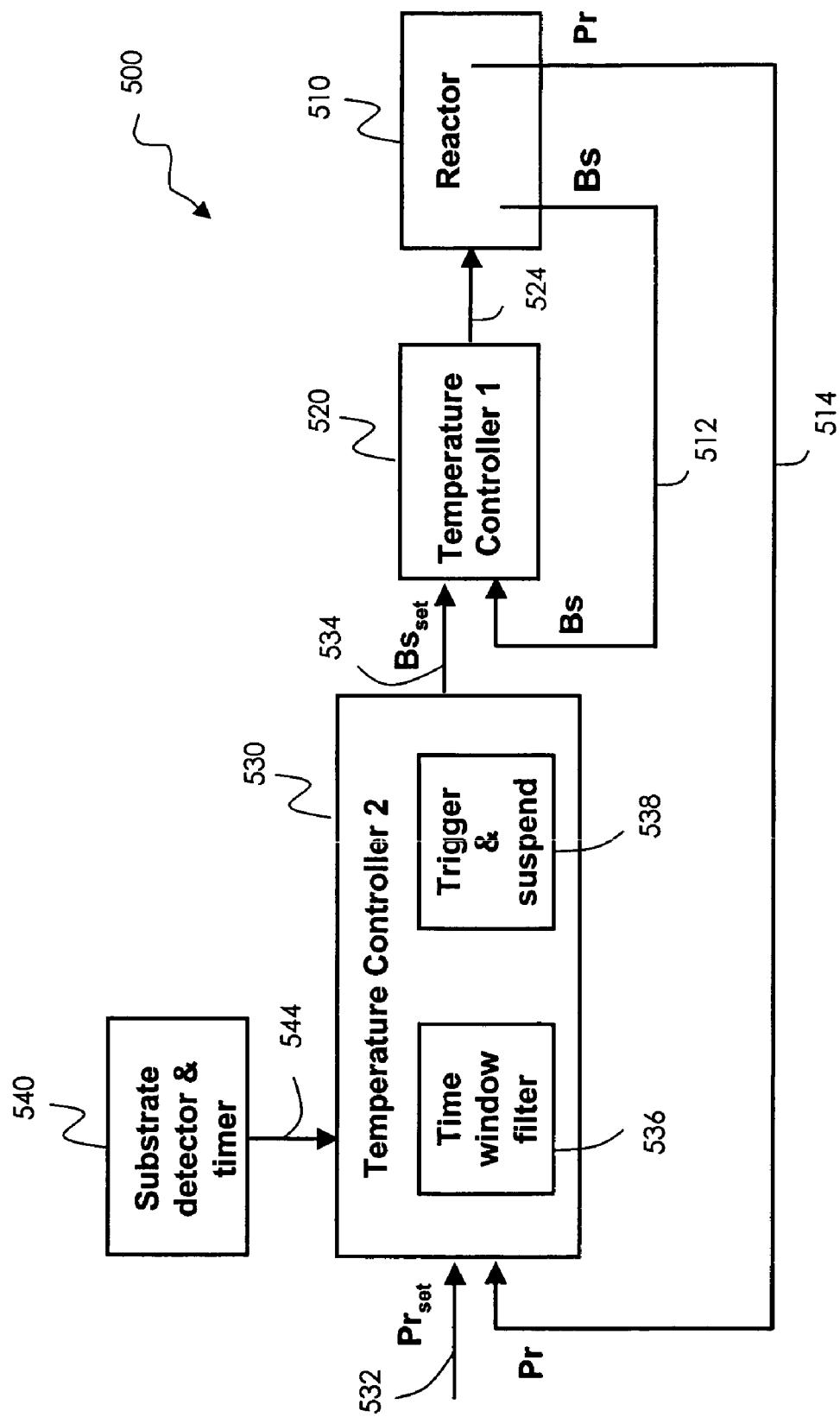
FIG. 6 shows, schematically, a temperature controller having two nested control loops, in accordance with a preferred embodiment of the invention.
Figure 7:
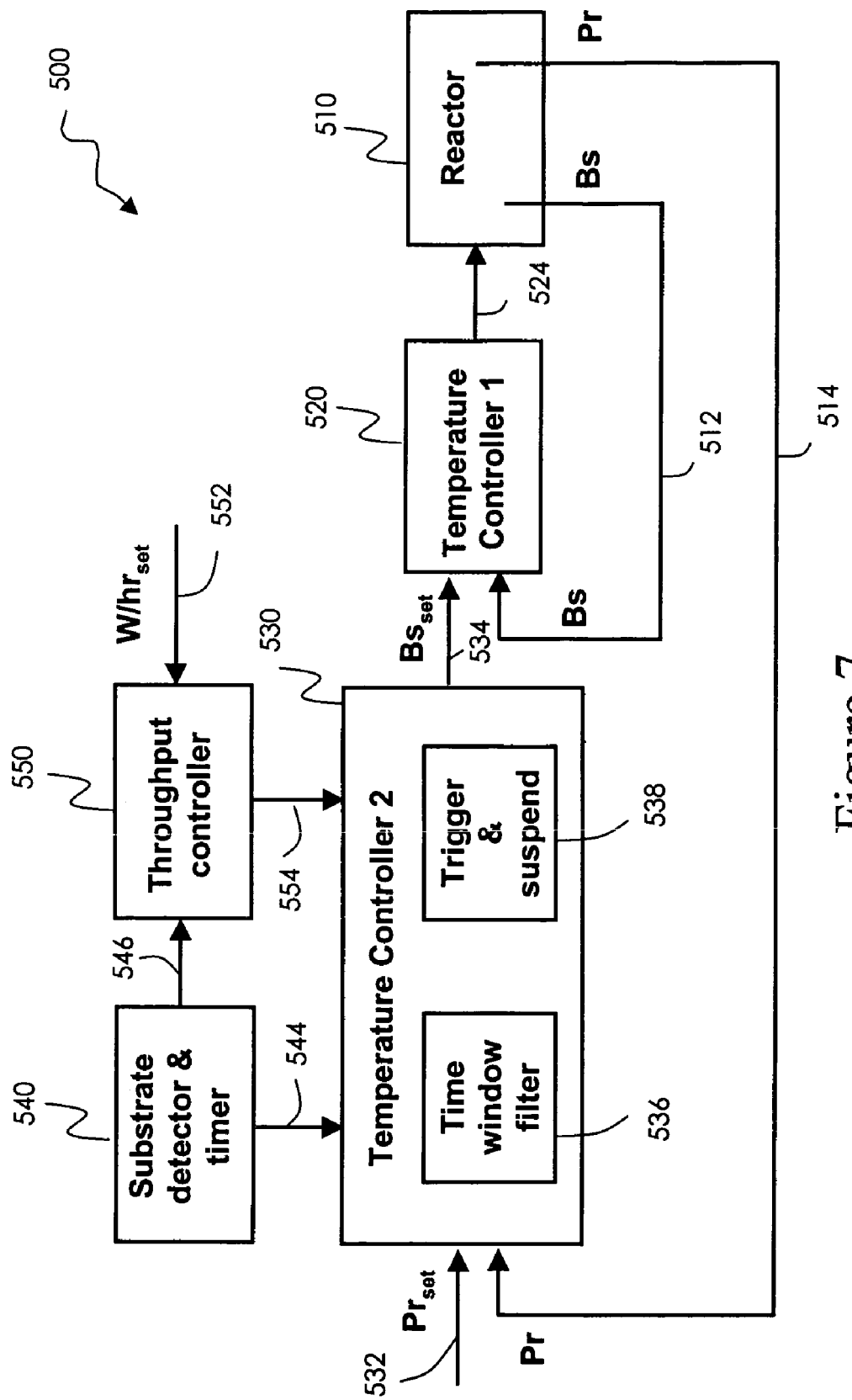
FIG. 7 shows, schematically, a temperature controller having two nested control loops, in accordance with another preferred embodiment of the invention.

FIGS. 5 through 7 illustrate several temperature control configurations having two nested control loops for controlling a heater and the resulting temperature of a furnace body. As noted above, a configuration having two nested control loops is commonly referred to as a cascade temperature control configuration. A temperature control configuration in accordance with an embodiment described in U.S. patent application Publication 2003/0027094 A1 is shown in FIG. 5. The processing system, including reactor 510 is indicated in its entirety by reference numeral 200. A first inner control loop comprises the first temperature controller 220 and receives a signal, Bs, from the backside temperature sensor 135 or 145 (FIGS. 1–3) as input via the line 212. A second input to the first controller 220 is a backside set-point signal, $Bs_{set}$, generated by the second temperature controller 230 and fed to the first temperature controller 220 through the line 234. A second, outer control loop comprises a second controller 230 and receives a signal, Pr, from the process temperature sensor 134 or 144 (FIGS. 1–3) as an input via the line 214. A second input to the second temperature controller 230 is a process temperature setpoint signal, $Pr_{set}$, fed to the second controller 230 via the line 232.

When regulating the temperature at the backside temperature sensor 135 or 145, the first controller 220 operates at a relatively high control frequency of typically one calculation per second or faster to achieve real-time temperature control performance. The second controller 230 can operate at the same high frequency as the first controller, but can also operate at a lower control frequency. A frequency of one calculation per about 2 to 10 seconds would be adequate, since the second control loop reacts intrinsically slower due to the larger distance between the heater 132 or 142 and the corresponding process temperature sensor 134 or 144, respectively.

Conventional temperature control systems, like that of FIG. 5, allow a steady state condition, such as a constant temperature, or a constant ramp or heat-up rate to be maintained. A change in this steady state condition in response to, e.g., changes in the furnace body temperature, will immediately invoke a reaction from both temperature controllers 220 and 230.

Advantageously, the preferred embodiments allow control of both a steady state condition and a dynamic situation where no steady state condition is achieved. For example, in sequentially processing a series of substrates 21, the control action of the second temperature controller 530 is optimized to supply an extra amount of heat during the treatment cycle of a substrate 21 to compensate for the withdrawal of heat by that substrate 21 and the heat loss by opening the housing 23 for loading and unloading that substrate 21. The control objective is a constant processing temperature just prior to loading each substrate 21 during the processing of an entire series of substrates 21. Thus, preferably both the temperature and the thermal recovery rate of the furnace bodies 130, 140 are controlled.

A temperature control configuration according to a preferred embodiment is shown in FIG. 6. The processing system, including a reactor 510 is indicated in its entirety by reference numeral 500. A first inner control loop comprises the first temperature controller 520 and uses a signal, Bs, from the backside temperature sensor 135 or 145 (FIGS. 1–3) as a backside temperature input via the line 512. A second input to the first controller 520 is a control or backside set-point signal, $Bs_{set}$, generated by a second temperature controller 530 and fed to the first temperature controller 520 through the line 534. The first, inner control loop operates at a relatively high control frequency of about 1 calculation per second or faster to adjust the power setting of a heater in the reactor 510.

The second, outer control loop comprises the second controller 530 and uses a signal, Pr, from the process temperature sensor 134 or 144 (FIGS. 1–3) as a process temperature input via the line 514. A second input to the second temperature controller 530 is a process temperature set-point signal, $Pr_{set}$, fed to the second controller 530 via the line 532.

The second, outer control loop also has a substrate detector and timer 540 that provides a signal indicating the moment in time when a substrate 21 is placed adjacent to the heated furnace bodies 130, 140 (FIGS. 1–3). This signal is fed to a second temperature controller 530 via line 544. The substrate detector and timer 540 can be a logistics controller, providing a signal to the second temperature controller 530 when the substrate 21 is expected to be placed adjacent the heated furnace bodies 130, 140. In other embodiments, a sensor can be provided to actively monitor for when a substrate 21 is placed adjacent to the heated furnace bodies 130, 140. Preferably, this sensor is the process temperature sensor 134, 144 and the moment in time that a substrate 21 is placed adjacent the furnace bodies 130, 140 is deduced from a drop in furnace body temperature.

The second controller 530 itself also comprises several features. A time window filter 536 is provided for filtering the process temperature values that are evaluated by the second controller 530 for control purposes. The process temperature values are preferably limited to those values recorded in a time window shortly before the placement of the substrate 21 adjacent to the furnace body 130, 140 or, more preferably, shortly before a drop in temperature is detected due to the placement of the cold substrate adjacent the heated furnace bodies 130, 140. In other arrangements, the process temperature values are those contained in a specified time window containing the highest measured temperature value.

Additionally, a trigger and suspend function 538 is provided. According to this function, positioning of the substrate 21 for heat treatment triggers the calculation of a new control or backside set-point output value $Bs_{set}$ based upon the process temperature values transmitted by the time window filter 536. Once the new $Bs_{set}$ has been calculated, this value is maintained as an output value until the substrate 21 is unloaded and the loading of the next substrate 21 is detected. This loading triggers the controller 530 to perform the $Bs_{set}$ calculation again, using as inputs the process temperatures measured shortly before placement of the next substrate 21, as transmitted by the time window filter 536. Consequently, the second control loop preferably performs one $Bs_{set}$ calculation per treated substrate 21.

The processing system 500 is particularly advantageous when multiple heating zones are present, each heating zone having its own process temperature sensor, backside temperature sensor and nested control loops. It is also particularly advantageous for methods of processing in which substrates are loaded for treatment after a desired process temperature is reached, causing a decrease in the process temperature, and unloaded before the process temperature is increased to the desired temperature again. In such a method, a substrate 21 (FIGS. 1–3) is preferably loaded for heat treatment by being placed adjacent to a furnace body 130, 140 that is at a desired process temperature and is then held adjacent to the furnace body 130, 140 during a heat treatment time. After elapse of the heat treatment time, the substrate 21 is unloaded from the reactor 1 or moved away from the furnace body 130, 140. The treatment time is so short that the substrate 21 will be removed before the process temperature has recovered to the desired processing temperature. Typically, the next substrate 21 for processing is placed adjacent to the furnace body 130, 140 when the desired process temperature has been reached again. The skilled artisan will readily appreciate that various other measurement composites can be monitored for determination of the readiness of the system for the next substrate.

The correct moment in time to load the next substrate 21 can be determined from the temperature of a main heating zone, such as a center zone 401 (FIG. 4). Alternatively, the time to load the next substrate 21 can be determined based upon the average or some other composite temperature combining readings from all heating zones, e.g., zones 401, 402 403, and 404.

The thermal recovery rate of the plurality of heating zones 401, 402 403, and 404, however, can differ and some zones can reach the desired process temperature sooner or later than other zones. As the furnace body 130, 140 (FIGS. 1–3) is relatively massive, the heating zones 401, 402 403, or 404 that achieve the desired process temperature before other the zones 401, 402 403, or 404 can undesirably overshoot the desired temperature. These uncontrolled differences in temperature at the beginning of the thermal treatment will result in a variation in thermal budget over the substrate and can cause non-uniform treatment results on the substrate 21. Therefore, to compensate for this, when the process temperature, Pr, of a heating zone within the time window just prior to loading a next substrate is higher or lower than the desired process temperature, $Pr_{set}$, the second temperature controller 530 can adjust $Bs_{set}$, to compensate for the different recovery rates of different the heating zones 401, 402 403, and 404. Consequently, by increasing or decreasing $Bs_{set}$ depending on whether a heating zone recovers slowly or quickly, all zones 401, 402 403, and 404 can reach their desired process temperature at the same time after the withdrawal of heat caused by the loading of a substrate. In this way the thermal budget over a substrate can be made uniform.

In another preferred embodiment, shown in FIG. 7, a throughput controller 550 is provided. The throughput controller 550 receives as inputs a signal from the substrate detector and timer 540 via the line 546, the signal being indicative of the actual throughput. The throughput controller 550 also receives a signal indicative of a desired throughput (e.g., wafers per hour, or $W/hr_{set}$) via input line 552.

When the actual throughput is lower than the desired throughput, an output signal is fed into the second temperature controller 530 via the line 554 to increases the backside temperature set-point for all zones 401, 402 403, and 404 simultaneously. This increase can, e.g., be a certain percentage of the actual temperature set-point or a certain percentage of the maximum temperature set-point. It will be appreciated that increasing the backside temperature set-point (for each heating zone) results in a larger temperature difference between the side of the furnace body that is facing the wafer and the side of the furnace body that is facing away from the wafer. This larger temperature difference results in a larger heat flow through the furnace body towards the side that is facing the wafer and, hence, in a faster recovery of the heating zones. This in turn allows loading the next substrate 21 sooner and, hence, results in a higher throughput. Conversely, when the actual throughput is higher than the desired throughput, a reduction in backside set-point for all zones can be applied. It will be appreciated that the maximum throughput is limited by the maximum capacity of the logistics of the system such as substrate handling robots, etc. and the maximum desired throughput preferably does not exceed this maximum capacity of the system logistics. It will also be appreciated that the precise amount of an increase or decrease in the backside temperature set-point can be determined based upon a relationship derived empirically from processing a plurality of wafers at different backside temperature set-points, or can be determined more theoretically based upon the thermal properties of a wafer 21 and of the reactor 1.

Figure 8:
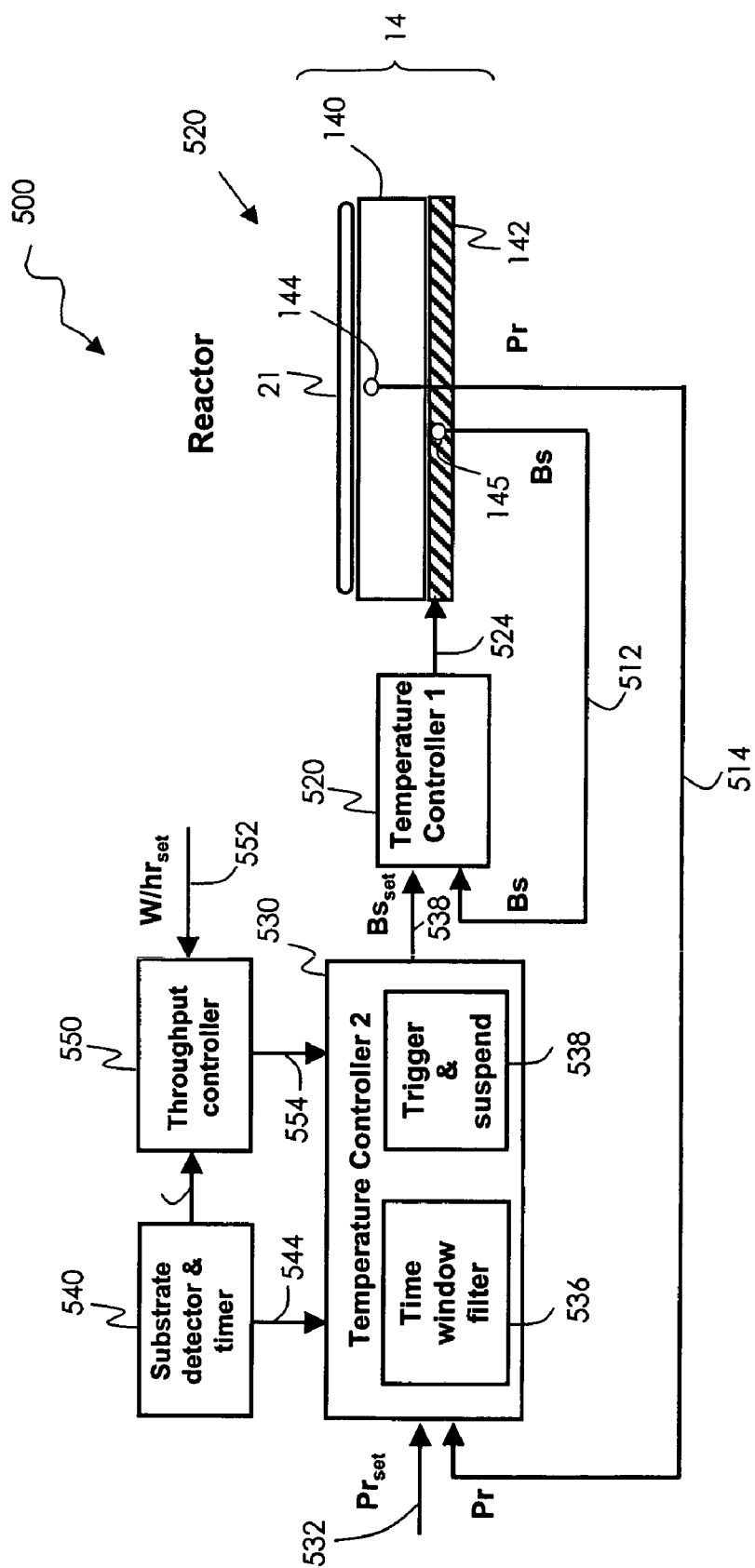
FIG. 8 shows, schematically, further details of the connection of a heat treatment apparatus with the temperature controller of FIG. 7, in accordance with preferred embodiments of the invention.

In FIG. 8, the control configuration of FIG. 7 is illustrated, with part of the heater block 14 (FIGS. 1–3) shown in greater detail. The furnace body 140 is provided with the heater 142, the process temperature sensor 144 and the backside temperature sensor 145. The substrate 21, e.g., a wafer, is placed adjacent to the furnace body 140. It will be appreciated that FIG. 7 is provided only to illustrate the connection of the first and second control loops with a process and backside temperature sensor. Other combinations and numbers of heaters and sensors can also be readily used. For example, as noted above, the reactor 1 preferably has two reactor blocks 13, 14, each of which has backside temperature sensors 135, 145, respectively, and process temperature sensors, 134, 144, respectively, connected to first and second temperature control loops, respectively. In addition, each reactor block 13, 14 preferably has a furnace body 130, 140 with multiple heating zones, each heating zone having separate temperature sensors and connected to separate first and second temperature control loops.

It will also be appreciated that the controllers 520 and 530 used in the control systems of FIGS. 6, 7 and 8 can be any controller known in the art. For example, PID (Proportional, Integral, Differential) controllers, H∞ controllers, model-based controllers, any combinations of these controllers with themselves or other controllers can be used. The first temperature controller 520 operates preferably at a relatively high control frequency of typically one calculation per second or faster to achieve real-time control performance. The second temperature controller 530 operates at a lower control frequency and performs one calculation per processed wafer. The throughput controller 550 can be any controller available in the art. In one preferred embodiment, controller 550 is a P (proportional) controller.

When multiple heating zones are present, each zone is preferably provided with a backside temperature sensor, a process temperature sensor and its own independent control loops. However, because the moment of wafer loading and the throughput of the reactor are the same for all heating zones, only one substrate detector and timer 540 and one throughput controller 550, providing inputs for all heating zone control loops, need be provided.

It will be appreciated that the functionality of the invention has been described schematically with reference to FIGS. 5 through 8, but that the invention can be implemented in hardware in numerous ways. For example, each controller 520 or 530 shown in the Figures can physically exist as a separate piece of hardware. Alternatively, multiple controller functions, or even all controller functions, can be performed by one hardware controller. For example, in one embodiment, the substrate detector and timer 540, throughput controller 550 and the second temperature controllers 530 for all heating zones can be combined in one hardware controller. In addition, all first temperature controllers 520 can be combined into a single second hardware controller.

Figure 9:
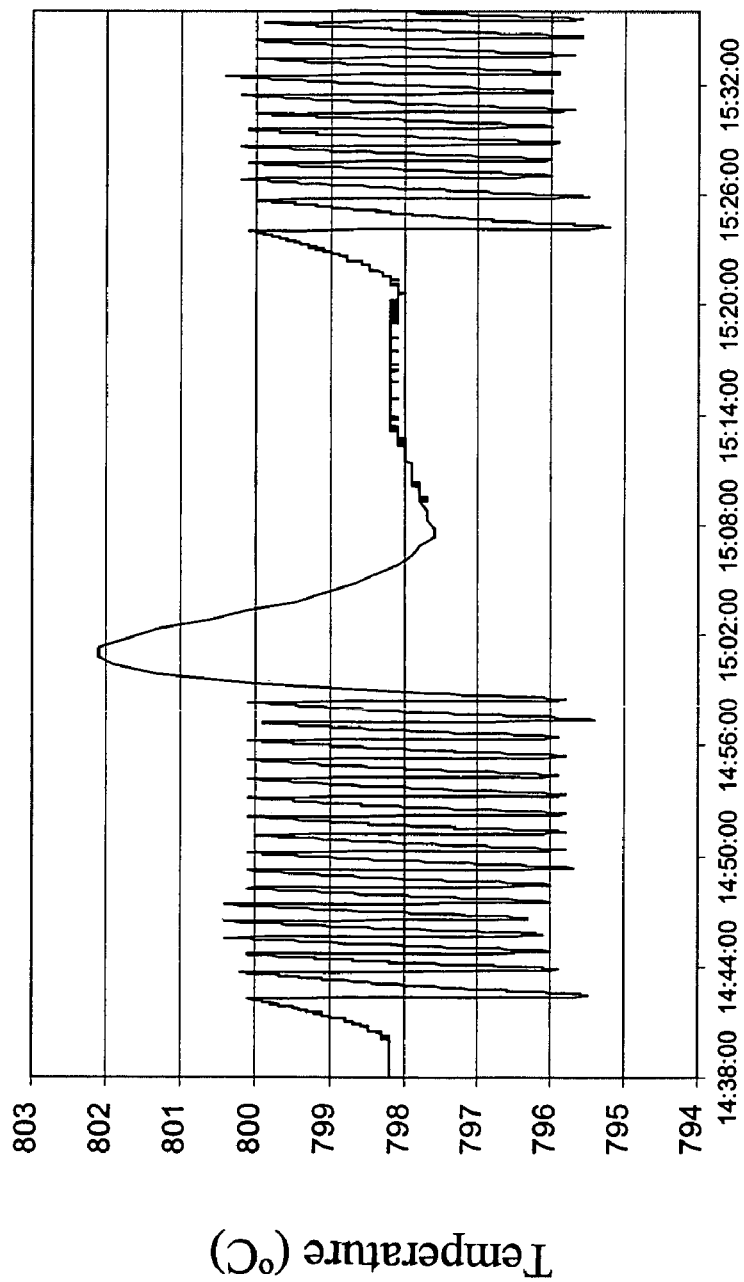
FIG. 9 shows a temperature-time plot of the processing of two series of substrates, in accordance with preferred embodiments of the invention.

With reference to FIGS. 9–12, the variation of process temperature over time will now be discussed. FIG. 9 shows a temperature-time plot of the processing of a first series of wafers and part of a second series of wafers. The process temperature of the "Top Center" heating zone is displayed and the desired processing temperature is 800° C. Prior to processing of the first series of wafers, the thermal reactor is in a standby condition at less than the desired processing temperature. At the start of processing, the temperature set-point is increased to the desired processing temperature. In this way, a flow of heat is established through the furnace body, from the heater side towards the side of the furnace body that faces the wafer. When the desired processing temperature is reached, the first wafer is loaded and placed adjacent to the furnace body, resulting in a temperature drop. The processing time in this case was 4 seconds. More generally, the processing time for rapid thermal annealing is between about 1 s and about 60 s, more preferably, between about 1 s and about 20 s. This relatively short processing time allows the wafer to be removed from the furnace body before the desired processing temperature is reached again. When the desired processing temperature is reached again, the next wafer is loaded, and so on until the complete series of wafers has been processed.

After processing four or more wafers, the complete cycle time for one wafer is about 55 seconds. For the first few wafers the thermal recovery is slower and the cycle time is correspondingly longer as the temperature profile in the furnace body and the corresponding heat flow towards the side of the furnace body that faces the wafer still has to be established at the appropriate level to anticipate the withdrawal of heat from the furnace body by the insertion of a relatively cold wafer.

At the end of the series of wafers no additional wafers are loaded, so that no heat is withdrawn from the furnace body, and a temperature overshoot can occur. Preferably, the temperature profile established by the first and second control loops can anticipate this and reduce $Bs_{set}$ after the last wafer has been loaded or even a few wafers earlier. The last wafer to be processed might be determined, for example, by an input from a logistics controller indicating that the last wafer has been processed. Additionally, the second temperature controller can be set to reduce $Bs_{set}$ if the wafer detector and timer 540 does not detect a wafer for a set period or if the processing temperature exceeds a predefined threshold.

If the measured process temperature at the boundary surface rises above the desired process temperature to the temperature of the heater, it takes time for the extra heat, accumulated in the furnace body at the heater side, to level out and for a steady state temperature profile to be established after $Bs_{set}$ is lowered to the standby temperature. As a result, at the end of the series of wafers, the processing temperature is above the desired processing temperature for about 4 minutes in the illustrated example. The processing temperature is then maintained at the standby temperature until processing of a new series of wafers is to commence.

The process temperature overshoot can be reduced by applying a lower backside temperature set-point during the processing of the series of wafers. This, however, will slow the temperature recovery during processing and the cycle time for processing a wafer will be increased, thereby negatively affecting process throughput. On the other hand, an overshoot decreases the maximum number of wafers that can be processed, since the temperature preferably is reduced to the desired process temperature value, or lower, before processing of the next series of wafers can be started. A flattening out of the overshoot, however, occurs only once during the processing of a series of wafers, whereas thermal recovery after loading a wafer occurs for each wafer. Consequently, a certain overshoot at the end of the processing of a series of wafers is preferably accepted to maximize the number of wafers that can be processed in the reactor over time.

Figure 10:
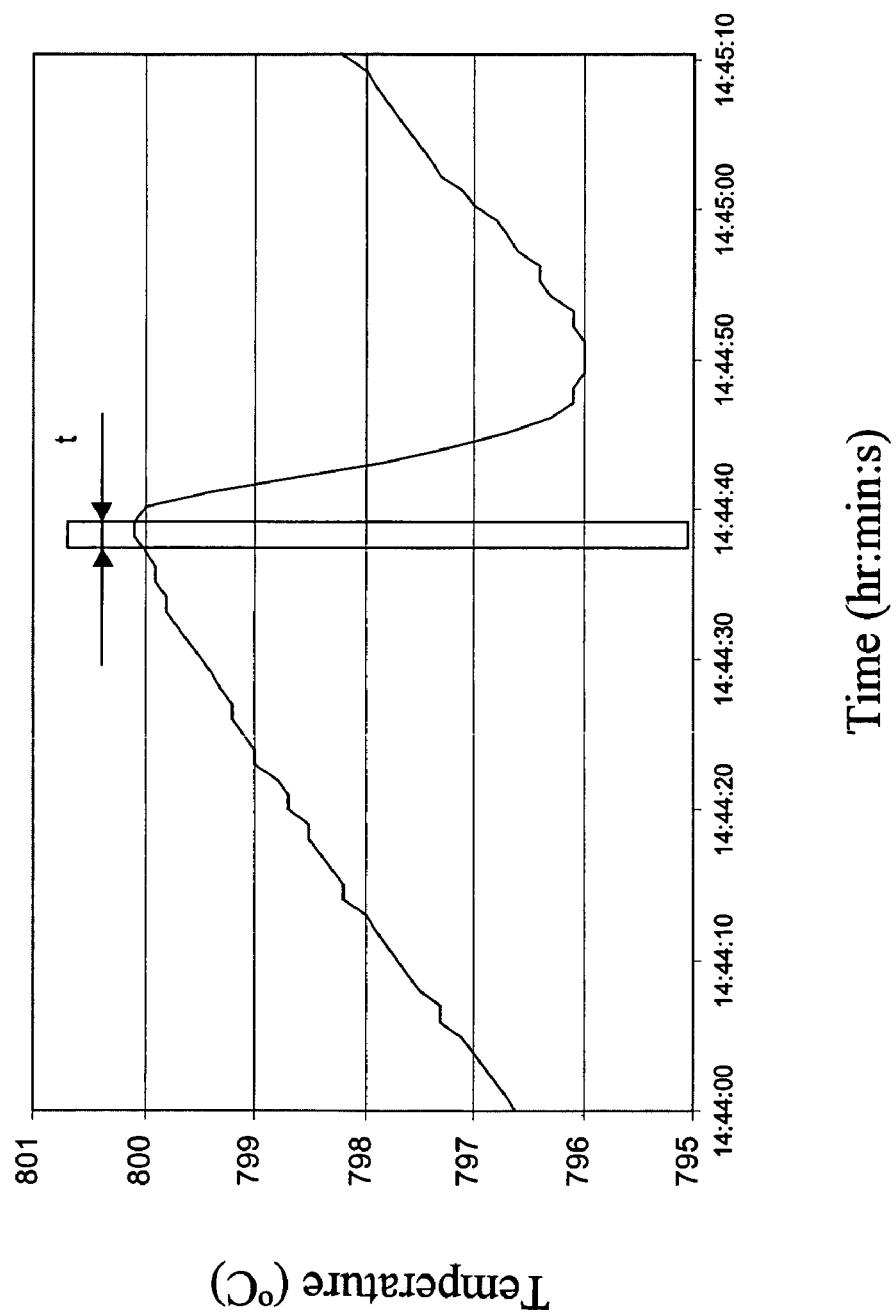
FIG. 10 shows an enlarged portion of the plot of FIG. 9.

FIG. 10 is an enlarged portion of FIG. 9 showing an example of a time window that is used for the temperature control. The time window, indicated by the two vertical lines, is positioned such that the temperatures within the time window are not yet affected by the placement of the cold wafer adjacent to the furnace body. Only temperatures within the time window are used for the temperature control. In the illustrated example the time resolution of the temperature measurement was 1 second and the 1 second time window comprises one temperature value. Alternatively, the time window and time resolution of the temperature measurement are such that more than one temperature measurement is taken, to minimize the possibility of an aberrant data point. For example, in such cases, outlying data points can be discarded and the remaining temperature measurements can be averaged.

Figure 11:
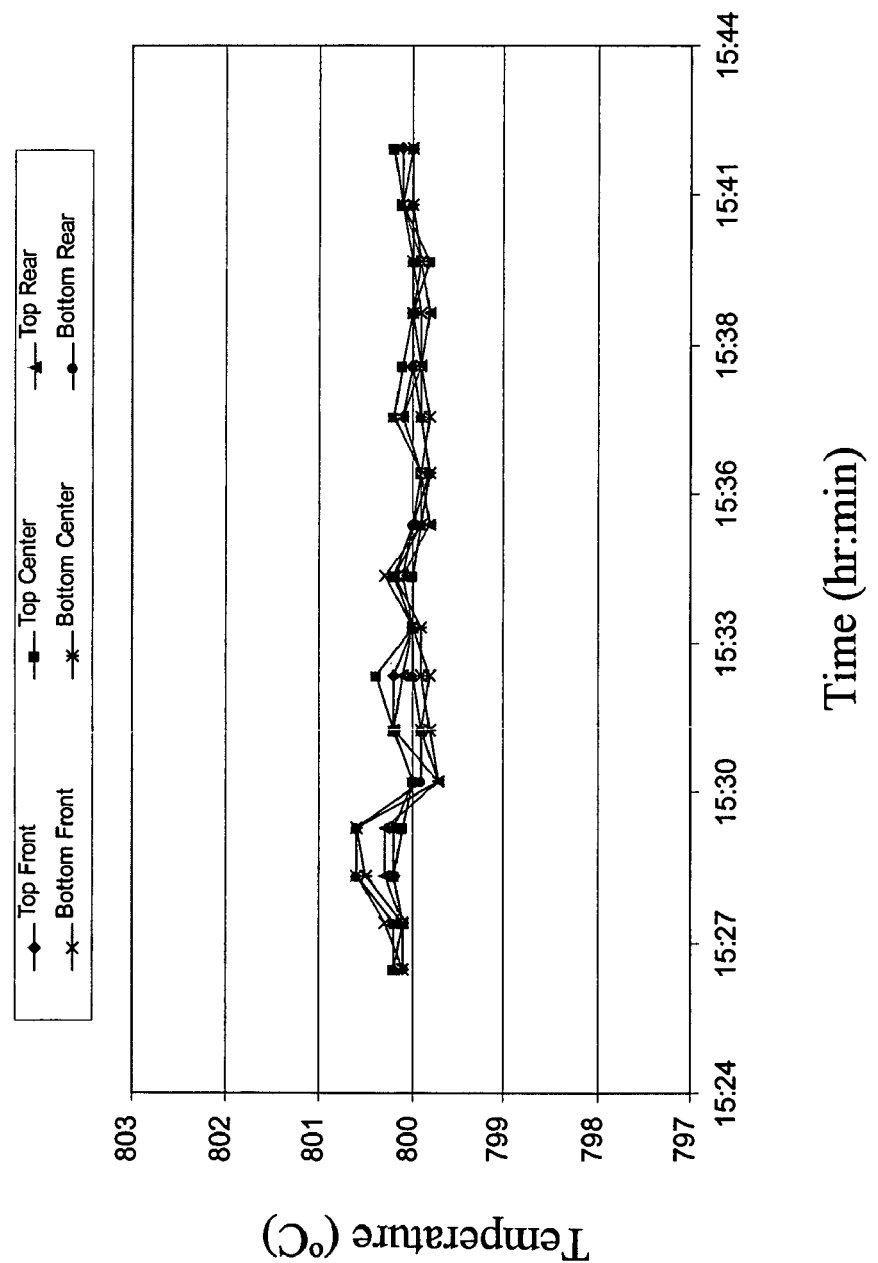
FIG. 11 shows the processing temperatures of each heating zone of an exemplary floating substrate reactor having six heating zones, the processing temperatures taken just prior to positioning a substrate for heat treatment adjacent the heating zones and the heating zones all having the same desired processing temperature, in accordance with preferred embodiments of the invention.
Figure 12:
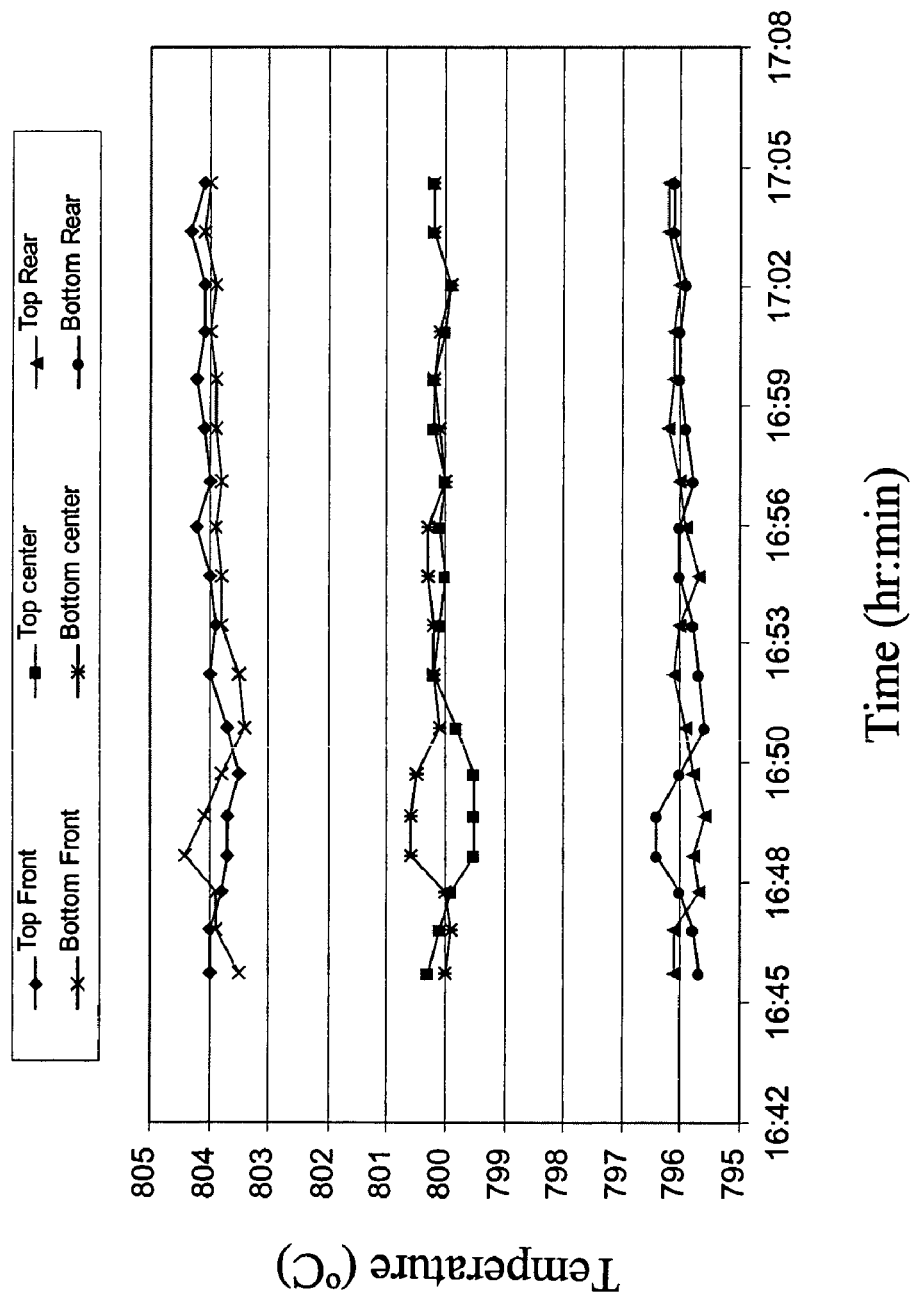
FIG. 12 shows the processing temperatures of each heating zone of an exemplary floating substrate reactor having six heating zones, the processing temperatures taken just prior to positioning a substrate for heat treatment adjacent the heating zones and the heating zones all having different desired processing temperatures to establish a temperature gradient across a reactor block, in accordance with preferred embodiments of the invention.

With reference to FIGS. 11 and 12, the temperatures within the time windows just prior to loading of a wafer are displayed for multiple heating zones. The heating zones are configured as shown in FIG. 4. Shown are the process temperatures, as measured by the process temperature sensors 134, 144 (FIGS. 1–3) for the Top Front 403, Top Center 401 and Top Rear 404 zones of the top furnace body 130 and for the Bottom Front 403, Bottom Center 401 and Bottom Rear 404 zones of the bottom furnace body 140.

Two different conditions are considered. In FIG. 11, all heating zones receive the same desired process temperature setpoint. In FIG. 12, different heating zones receive a different desired process temperature setpoint with the purpose of establishing a controlled temperature gradient over the furnace body to, e.g., compensate for different times of exposure to different areas of the wafer due to length of loading/unloading time relative to short processing times. A method for compensating for the effects of loading/unloading times with temperature gradients is discussed in U.S. application Ser. No. 10/141,517, TEMPERATURE CONTROL FOR SINGLE SUBSTRATE SEMICONDUCTOR PROCESSING REACTOR, filed May 8, 2002 and assigned to ASM International, N.V., the disclosure of which is incorporated herein by reference in its entirety. It can be observed that a temperature reproducibility of about 0.5° C. or better is achieved in both cases, which is considered to be a good result for heating zones undergoing dynamic and transient operation.

Preferably, a profiling procedure is performed before a series of wafers is processed. Without processing any wafers, such a procedure determines the required backside temperature set-points for achieving a desired process temperature in a steady state condition. During processing, this pre-determined backside temperature set-point is taken as a starting point for the backside temperature control.

In cases where a temperature gradient is desired over the furnace body, for optimum results, the profiling procedure preferably approximates such a gradient and determines particular backside temperature set-points for each heating zone. The respective heating zones influence each other's heat-up rate in a non-linear way and such a profiling procedure is desirable for ensuring that the initial set-points are appropriate for the desired values.

It will be appreciated that although the preferred embodiments have been described with resistive heating coils directly adjacent a furnace body, the embodiments of the invention are not limited to such as arrangement. For example, the heating coils can be arranged in or on the furnace body or directly adjacent to the furnace body. It is also possible for the heater to comprise lamps or an induction coil and to be arranged some distance away from the furnace body. Moreover, while the reactor preferably is provided with two furnace bodies, each with a heater, in other arrangements, only one furnace body may be present or only one of the furnace bodies may be heated.

In addition, while the temperature controllers are described as being connected to one backside or one process temperature sensor, in other embodiments, each control loop can be connected to multiple temperature sensors, e.g., multiple backside or multiple process temperature sensors. In such an arrangement, the outputs of the sensors are preferably averaged or otherwise composited before or upon being received by the control loops.

It will also be appreciated that before or after being placed in the heat treatment position, a substrate need not be removed from the reactor. For example, after the substrate has been moved away from the heated furnace body after completion of a heat treatment, e.g., by opening the reactor as shown in FIG. 3, it can be moved into the vicinity of an essentially flat cooling body, so that cooling also takes place in a rapid and controlled manner.

In addition, in some embodiments, the calculation condition for triggering a recalculation of the heating power intensity need not be the loading or unloading or a substrate. For example, a local temperature minimum (e.g., caused when the positioning of a wafer for processing causes a reduction in the furnace body temperature) or maximum between loading of successive substrates can be the triggering condition for a recalculation. Also, a change in gas flows (e.g., flowing a less conductive gas to minimize further heating of a substrate) can be the calculation. Preferably, the calculation condition occurs at the same frequency as the wafer cycles.

It will also be appreciated that although the present invention is described in relation to the Levitor® reactor, having two facing furnace bodies between which a substrate is accommodated, the invention can also be embodied by a reactor having only one furnace body, wherein a substrate is placed adjacent the furnace body for the duration of the treatment.

Accordingly, it will be appreciated by those skilled in the art that other various omissions, additions and modifications can be made to the processes described above without departing from the scope of the invention. All such modifications and changes are intended to fall within the scope of the invention, as defined by the appended claims.

We claim:

1. A heat treatment apparatus for successively heat treating a series of planar substrates one by one in a plurality of heat treatment cycles, the apparatus comprising:
    a furnace body having a boundary surface oriented to face one of the series of substrates upon positioning of the substrate in the heat treatment apparatus for heat treatment;
    a controllable heater configured to heat the furnace body at a power level set by a power setting;
    a heat treatment temperature sensor configured to measure a treatment temperature experienced by the substrate during heat treatment; and
    a temperature regulator for controlling the treatment temperature, the temperature regulator configured to receive a heat treatment temperature reading from the treatment temperature sensor, to receive a desired temperature input for a desired treatment temperature and to generate and to output the power setting for the heater, wherein the temperature regulator further comprises:
        a first computational component configured to generate one or more trigger signals resonant with a frequency of the heat treatment cycles; and
        a second computational component configured to calculate a control set-point, the control set-point at least partially determining the power setting for the heater, the second computational component further configured to receive the trigger signals and to calculate, upon receiving the trigger signals, a new control set-point using the treatment temperature readings and to hold the new control set-point until the calculation is triggered again by a next trigger signal.

2. The heat treatment apparatus of claim 1, wherein the first computational component comprises a logistics controller configured to provide a trigger signal indicating a loading of one of the series of substrates into the apparatus for heat treatment.

3. The heat treatment apparatus of claim 1, wherein the first computational component is configured to receive treatment temperature readings from the heat treatment temperature sensor and to generate during each treatment cycle one or more trigger signals based on the treatment temperature readings.

4. The heat treatment apparatus of claim 3, wherein the first computational component is configured to generate a trigger signal when a desired treatment temperature is reached.

5. The heat treatment apparatus of claim 4, further comprising a logistics controller, the logistics controller configured to receive the trigger signal corresponding to receiving the desired treatment temperature and loading a next substrate upon receiving the trigger signal.

6. The heat treatment apparatus of claim 3, wherein the first computational component is configured to generate a trigger signal when a treatment temperature minimum within a treatment cycle is reached.

7. The heat treatment apparatus of claim 1, wherein the control set-point is the power setting.

8. The heat treatment apparatus of claim 1, wherein the furnace body has a plurality of heating zones.

9. The heat treatment apparatus of claim 8, wherein each of the plurality of heating zones has an independently controlled heater.

10. The heat treatment apparatus of claim 1, wherein the heat treatment temperature sensor is inside the furnace body and proximate the boundary surface.

11. The heat treatment apparatus of claim 1, further comprising:
    a heater side temperature sensor configured to measure a heater side temperature at a part of the furnace body proximate the heater; and
    wherein the control set-point is a target heater side temperature and wherein the temperature regulator for controlling the treatment temperature comprises:
        a boundary surface temperature regulator constituting part of the second computational component, the boundary surface temperature regulator configured to receive the desired temperature input and the reading from the heat treatment temperature sensor and to calculate and to output the control set-point; and
        a heater side temperature regulator configured to receive a temperature reading from the heater side temperature sensor and to receive the control set-point, wherein the heater side temperature regulator is further configured to regulate the heater side temperature at the control set-point value by generating and outputting the power setting for the heater.

12. The heat treatment apparatus of claim 11, wherein the boundary surface temperature regulator and the heater side temperature regulator are separate pieces of hardware.

13. The heat treatment apparatus of claim 11, wherein the heater side temperature regulator is configured to adjust the power level of the heater about once every second or less to maintain the heater side temperature at the control set-point value.

14. The heat treatment apparatus of claim 12, wherein the boundary surface temperature regulator and the heater side temperature regulator are each chosen from the group consisting of PID controllers, H∞ controllers, and model-based controllers.

15. The heat treatment apparatus of claim 12, wherein the boundary surface temperature regulator and the heater side temperature regulator are included in a single piece of hardware.

16. The heat treatment apparatus of claim 1, further comprising:

a time window filter configured to output one or more filtered treatment temperature readings that are measured by the treatment temperature sensor within a time window and to block treatment temperature readings that are outside the time window, wherein the treatment temperature readings used to calculate the new control set-point are the one or more filtered temperature readings.

17. The heat treatment apparatus of claim 16, wherein the time window filter is configured to output filtered treatment temperature readings from about a moment of the positioning of the substrate in the heat treatment apparatus for heat treatment.

18. The heat treatment apparatus of claim 17, wherein the filtered treatment temperature readings comprise only temperature readings from about 0.1 to 3 seconds before the moment of the positioning of the substrate.

19. The heat treatment apparatus of claim 1, further comprising:

a throughput controller connected to the temperature regulator, the throughput controller configured to receive a desired throughput input indicating a desired heat treatment throughput of substrates for the heat treatment apparatus and to receive an input indicating an actual throughput of substrates for the heat treatment apparatus and to output a throughput control signal to the second computational component based on the inputs, wherein the second computational component is configured to calculate the new control set-point based at least partially upon the throughput control signal.

20. The heat treatment apparatus of claim 19, wherein the throughput controller is a P controller.

21. The heat treatment apparatus of claim 19, wherein the throughput controller and the temperature regulator are included in a single piece of hardware.

22. A semiconductor processing reactor for individually treating a series of substrates, comprising:

a boundary surface for facing one of the series of substrates during heat treatment, the boundary surface comprising a plurality of heating zones;

a plurality of temperature sensors proximate the boundary surface, the plurality of temperature sensors configured to measure a boundary surface temperature of each heating zone;

a plurality of independently controlled heaters for heating each of the plurality of heating zones to a desired processing temperature, each heater having a control set-point for determining a power level of that heater;

a substrate loading signal generator configured to trigger a loading of one of the series of substrates into the reactor about when one or more of the plurality of heating zones reaches a desired processing temperature; and one or more temperature controllers for regulating the boundary surface temperature, wherein the one or more temperature controllers is configured to receive the boundary surface temperature readings and to calculate, at a recalculation frequency resonant with a loading frequency of each of the series of substrates, a next control set-point for each heating zone for a next one of the series of substrates.

23. The reactor of claim 22, further comrpising a temperature reading filter configured to receive and filter the boundary surface temperature readings outside a time window and to output one or more filtered temperature readings encompassed within the time window.

24. The reactor of claim 22, wherein the one or more temperature controllers have a recalculation frequency of once per loading of each of the series of substrates.

25. The reactor of claim 22, wherein each heating zone is associated with its own heater, temperature sensor and temperature controller.

26. The reactor of claim 25, wherein each heating zone is configured to have the same desired temperature reading.

27. The reactor of claim 22, wherein the temperature reading filter is configured to output an average of the temperatures in the time window as the one or more filtered temperature readings.

28. The reactor of claim 27, wherein the time window spans a time between the loading of one of the series of substrates and the loading of the next one of the series of substrates for heat treatment.

29. The reactor of claim 22, further comprising:

a second heated surface opposite the boundary surface, wherein a substrate is accommodated between the second heated surface and the boundary surface during heat treatment.

30. The reactor of claim 29, configured to suspend the substrate with flowing gas between the second heated surface and the boundary surface without mechanically contacting either the second heated surface or the boundary surface.

31. The reactor of claim 30, wherein the second heated surface and the boundary surface each comprise a plurality of heating zones.

32. The reactor of claim 31, wherein a spatial arrangement and number of heating zones in each of the second heated surface and the boundary surface are the same.

33. The reactor of claim 22, further comprising a throughput controller connected to the one or more temperature controllers, the throughput controller configured to provide an input to the one or more temperature controllers to adjust calculation of the next control set-point depending upon a desired throughput and an actual throughput of the reator.

34. An apparatus for semiconductor processing, the apparatus configured to process a plurality of substrates one by one, the apparatus comprising:

a heating body having a surface delimiting a substrate processing position;

a controllable heater for heating the heating body, wherein the heater is proximate the heating body and has a control set-point controlling a heater temperature;

a heat treatment temperature sensor configured to trigger a loading of one of the series of substrates when a temperature at the substrate processing position reaches a desired temperature;

a timer configured to determine an instantaneous actual throughput of the apparatus; and a temperature regulator for controlling the processing temperature, the temperature regulator configured to receive a throughput input indicating a desired processing throughput and to calculate and to output, after the loading of the one of the series of substrates is triggered, a new control set-point to the heater based at least partially upon the throughput input and the instantaneous actual throughput.

35. The apparatus of claim 34, wherein the temperature regulator is configured to calculate the new control set-point immediately after the loading of one of the series of substrates is triggered, wherein the new control set-point is calculated based at least partially upon the instantaneous actual throughput.

36. The apparatus of claim 34, wherein the control set-point is a desired temperature for a part of the heating body proximate the heater and wherein the apparatus further comprises:
a second temperature sensor proximate the heater and configured to measure a temperature of a part of the heating body proximate the heater; and
wherein the temperature regulator comprises a heater side temperature regulator connected to the heater and the second temperature sensor, the heater side temperature regulator configured to continuously adjust the heater temperature to maintain the part of the heating body proximate the heater at about the control set-point value.

37. The apparatus of claim 36, wherein the heater side temperature regulator is configured to adjust the heater temperature about once every second or less.

38. The reactor of claim 34, wherein the temperature regulator is configured to receive temperature readings from the heat treatment temperature sensor and to calculate and output a new control set-point based upon a temperature reading at about or immediately before the loading of one of the series of substrates to maintain the temperature at the substrate processing position at the desired temperature.

39. The reactor of claim 34, wherein the heating treatment temperature sensor is located inside the heating body and less than about 5 mm away from the surface.

40. The reactor of claim 39, wherein the heating treatment temperature sensor is located less than about 2 mm away from the boundary surface.

41. A method for individually processing a series of semiconductor substrates, comprising:
providing a reactor having a process chamber, the chamber having a process temperature, wherein the reactor has a heater for heating the chamber to a desired process temperature, wherein the heater has a control set-point for determining a power level of the heater;
successively loading each of the series of substrates into the chamber and then unloading each of the series of substrates out of the chamber, wherein loading a substrate into the chamber reduces the process temperature, wherein the heater set at the control set-point heats the chamber back up to the desired process temperature after loading the substrate reduces the process temperature, wherein loading is performed about when the chamber is at the desired process temperature and unloading is performed before the substrate reaches the desired process temperature again;
monitoring the chamber for a calculation condition, wherein meeting the calculation condition triggers a calculation of a new control set-point based upon one or more process temperature readings; and
calculating the new control set-point, wherein calculating is performed at a frequency resonant with a substrate loading or unloading frequency, wherein the control set-point is held until the calculation condition is met again.

42. The method of claim 41, wherein the calculation of the control set-point is based upon one or more process temperature readings before or during about when the calculation condition is met.

43. The method of claim 41, wherein calculating is performed at least once between loading of successive substrates.

44. The method of claim 41, wherein the calculation condition is met by a loading or an unloading of a substrate.

45. The method of claim 41, wherein the calculation condition is met when a process temperature of the chamber is at a minimum or a maximum temperature between loading of successive substrates.

46. The method of claim 41, wherein the calculation condition is met when a flow of gas through the chamber is altered.

47. The method of claim 41, wherein the heater is configured to heat a heating body, thereby heating the chamber to the desired process temperature.

48. The method of claim 47, wherein the heating body comprises a plurality of heating zones, wherein each heating zone is heated by a different heater to a different desired temperature.

49. The method of claim 47, wherein the control set-point is a desired temperature of a part of the heating body proximate the heater.

50. The method of claim 49, wherein the heater is connected to a first temperature controller configured to analyze a temperature of the part of the heating body proximate the heater and to adjust the power level of the heater to maintain the temperature at the desired temperature of the part of the heating body proximate the heater.

51. The method of claim 50, wherein the power level of the heater is adjusted about once per second.

52. The method of claim 41, wherein the control set-point is the setting of the power level.

53. The method of claim 41, wherein calculating the new control set-point comprises filtering all process temperature readings to arrive at process temperature readings in a period immediately before the second substrate reduces the process temperature.

54. The method of claim 53, wherein the period spans about 1 to about 10 measured temperature values.

55. A method for heat treating a series of semiconductor substrates one by one, comprising:
providing a reactor having a heat treatment position for heat treating each of the series of substrates, wherein the reactor has a throughput input indicating a desired heat treatment throughput of substrates and a treatment temperature input indicating a desired treatment temperature and wherein the reactor has a heater with a control set-point for establishing the desired treatment temperature at the heat treatment position;
successively positioning each of the series of substrates at and removing each of the series of substrates from the heat treatment position, wherein a time from loading one substrate to a next substrate constitutes a substrate cycle;
measuring the treatment temperature as a function of time; and
calculating and applying only one new control set-point during each substrate cycle, wherein the new control set-point is determined at least partially based upon the desired treatment temperature, the measured treatment temperature, and the desired heat treatment throughput for the series of substrates.

56. The method of claim 55, wherein successively positioning each substrate is performed when the heat treatment position is at about the desired treatment temperature, wherein positioning each substrate reduces a temperature at the heat treatment position and removing is performed before the heat treatment position recovers to the desired temperature.

57. The method of claim 55, wherein a duration of the substrate cycle determines an actual heat treatment throughput of the reactor.

58. The method of claim 57, wherein the new control set-point is determined at least partially based upon the actual heat treatment throughput.

59. The method of claim 55, wherein measuring is performed at least once per substrate cycle and at about the same time, relative to each successive positioning, during each substrate cycle.

60. The method of claim 55, further comprising detecting the positioning of each of the series of substrates at the heat treatment position to trigger calculating a new control set-point.

61. The method of claim 60, wherein detecting comprises determining when a substrate is at the heat treatment position based upon a reactor logistics controller.

62. The method of claim 60, wherein detecting comprises actively monitoring the heat treatment position for a presence of a substrate.

63. The method of claim 62, wherein monitoring the heat treatment position comprises sensing a decrease in furnace body temperature caused by positioning a substrate at the heat treatment position.

64. The method of claim 55, further comprising suspending each of the substrates at the heat treatment position without mechanically contacting the substrate after successively positioning.

65. The method of claim 64, wherein reactor comprises a top furnace body and a bottom furnace body between which the substrate is suspended, wherein suspending the substrate comprises flowing gas from the top furnace body and the bottom furnace body to the substrate.

66. The method of claim 55, wherein successively positioning each of the series of substrates at a heat treatment position comprises positioning each substrate less than about 2 mm from the heating body.

67. The method of claim 66, wherein successively positioning each of the series of substrates at a heat treatment position comprises positioning each substrate less than about 1 mm from the heating body.

68. The method of claim 55, further comprising reducing the control set-point after removing a last of the plurality of substrates.

69. The method of claim 55, wherein the heating element set-point is increased in response to an increase of the desired heat treatment throughput.

70. The method of claim 55, further comprising performing a profiling procedure before positioning a first of the plurality of substrates, wherein the profiling procedure comprises determining an initial control set-point, the initial control set-point allowing the heated body to be maintained at the desired temperature at steady state, and storing the initial control set-point in a memory.

71. The method of claim 55, wherein calculating is triggered by positioning of each of the series of substrates at the heat treatment position.

* * * * *

UNITED STATES PATENT AND TRADEMARK OFFICE
CERTIFICATE OF CORRECTION

PATENT NO. : 6,940,047 B2 Page 1 of 1
DATED : September 6, 2005
INVENTOR(S) : van Kesteren et al.

It is certified that error appears in the above-identified patent and that said Letters Patent is hereby corrected as shown below:

<u>Title page,</u>
Item [56], References Cited, OTHER PUBLICATIONS,
"Porter, et al.," reference, delete "Fast ramp" and insert -- Fast-ramp --.

<u>Column 1,</u>
Line 19, delete "DERVATIVE" and insert -- DERIVATIVE --.

<u>Column 8,</u>
Line 63, delete "cyle" and insert -- cycle --.

<u>Column 15,</u>
Line 9, after "$Bs_{set}$" delete ",".

<u>Column 21,</u>
Line 63, delete "comrpising" and insert -- comprising --.

<u>Column 22,</u>
Line 39, delete "reator" and insert -- reactor --.

Signed and Sealed this

Twenty-third Day of May, 2006

JON W. DUDAS
*Director of the United States Patent and Trademark Office*